United States Patent [19]

Takase et al.

[11] Patent Number: 5,463,229
[45] Date of Patent: Oct. 31, 1995

[54] CIRCUIT BOARD FOR OPTICAL DEVICES

[75] Inventors: Mitsuo Takase, Kamagaya; Nobuhiro Fukuda, Yokohama; Toshihiro Dodo, Chigasaki, all of Japan

[73] Assignee: Mitsui Toatsu Chemicals, Incorporated, Tokyo, Japan

[21] Appl. No.: 224,534

[22] Filed: Apr. 7, 1994

[30] Foreign Application Priority Data

Apr. 7, 1993 [JP] Japan .................................. 5-080429
May 26, 1993 [JP] Japan .................................. 5-124057

[51] Int. Cl.$^6$ .......................... H01L 27/14; H01L 31/12; H01L 31/16
[52] U.S. Cl. ................. 257/59; 257/82; 257/98; 257/434; 257/435; 257/680
[58] Field of Search .................... 257/59, 72, 99, 257/98, 432, 433, 434, 435, 680, 81, 82

[56] References Cited

U.S. PATENT DOCUMENTS

| | | | |
|---|---|---|---|
| 4,011,575 | 3/1977 | Groves | 257/99 X |
| 4,229,736 | 10/1980 | Rougeot | 257/99 X |
| 5,349,210 | 9/1994 | Ackley et al. | 257/85 X |

FOREIGN PATENT DOCUMENTS

| | | |
|---|---|---|
| 0319907 | 6/1989 | European Pat. Off. . |
| 0462345 | 12/1991 | European Pat. Off. . |
| 0520841 | 12/1992 | European Pat. Off. . |
| 3739964 | 6/1988 | Germany . |
| 58-130581 | 8/1983 | Japan .................................. 257/99 |
| 2228366 | 8/1990 | United Kingdom . |

OTHER PUBLICATIONS

Patent Abstracts of Japan, vol. 7, No. 27 (E-156), Feb. 3, 1983, JP-A-57 183 175, Nov. 11, 1982.
Patent Abstracts of Japan, vol. 15, No. 4 (E-1020), Jan. 8, 1991, JP-A-02 260 867, Oct. 23, 1990.

*Primary Examiner*—William Mintel
*Attorney, Agent, or Firm*—Oblon, Spivak, McClelland, Maier, & Neustadt

[57] ABSTRACT

A circuit board for mounting one or more optical devices such as light receiving LSI chips and light emitting LSI chips. The circuit board has a flexible transparent substrate, a window portion which is formed as a slit-like transparent region of the transparent substrate, a plurality of electrodes for bonding the optical devices thereon provided on one surface of the substrate, a plurality of aggregated electrodes provided on the other surface on a region corresponding to the electrodes in a manner extending respectively in the longitudinal direction of the window portion and electrical connection portions penetrating the substrate. Each of the aggregated electrodes is electrically connected with two or more of the electrodes through the electrical connection portion. The circuit board will be used in, for example, an optical reader, an optical printer or the like in such a manner that the light which is coming in and/or going out of the optical device is transmitted through the window portion.

39 Claims, 17 Drawing Sheets

CIRCUIT BOARD FOR OPTICAL DEVICES

BACKGROUND OF THE INVENTION

1. Field of the Invention

The present invention relates to a circuit board for mounting an optical device to be used in light/electricity conversion or electricity/light conversion, more particularly to an optical device circuit board to be used for an optical reader, optical image forming device, optical printer or the like.

2. Description of the Related Art

Recently, an electronic circuit has been applied in a wide variety of fields from, for example, business equipment to household articles or toys, and accordingly the development of small type, light weight, high speed and accurate equipment is now in progress. Also in the field of various kinds of image input terminal equipment including a high-speed facsimile, a scanner, a white board copying machine, or such as a copying machine represented by electrophotography, there is an increasing demand for the equipment of high quality, high resolution, capable of handling a half-tone image while having a simple, compact structure and also can be produced at low cost.

In the image input terminal equipment as above, optical information is converted to an electric signal by means of an image sensor. FIG. 1 is a typical cross sectional view illustrating an example of the structure of a conventional image sensor. In FIG. 1, a shading layer 52 is provided on a glass substrate 51 with a slender part cut out to form a slit 52a. The slit 52a extends in the direction perpendicular to the surface of the paper showing the figure, and FIG. 1 is a cross sectional view taken along the plane perpendicular to the longitudinal direction of the slit 52a. A transparent insulation layer 53 is provided in a manner to cover the shading layer 52 and slit 52a, and a plurality of light receiving devices 56 and electrodes 54 electrically connected therewith respectively are provided on the transparent insulation layer 53. The light receiving devices 56 are disposed along the longitudinal direction of the slit 52a. A transparent protective layer 55 is provided so as to cover the whole area of the transparent insulation layer 53, electrode 54 and light receiving device 56, and on the surface of the transparent protective layer 55, i.e., on the outermost surface of the image sensor, a transparent conductive layer 57 is formed. This image sensor is manufactured as a unit.

For reading a letter or a figure on a manuscript 59 by using this image sensor, it is enough when the manuscript 59 is placed on the surface of a transparent conductive layer 57 so that the manuscript can be moved in the direction of an arrow shown in the figure with a dotted line by means of a roller 60, and further provide a light source 58 on the side of the glass substrate 51 to make light 61 from the light source 58 pass through the slit 52a and reflect on the surface of the manuscript 59 to enter into the light receiving device 56. By transferring the manuscript in this state by means of the roller 60, an image is inputted by line scanning.

Since it has been necessary to provide a number of light receiving devices 56 along the longitudinal direction of the slit 52a, a light detecting device with an amorphous semiconductor has been used as the light receiving device 56. However, the amorphous semiconductor device has defects such as low photo detecting sensitivity, the characteristic tends to be greatly deteriorated when exposed to light for a long time period and a small responding rate. Therefore, it is difficult to operate at a rapid reading rate when the amorphous semiconductor is employed as the light receiving device.

On the other hand, a light receiving device using a crystal semiconductor is characterized by the excellent photo sensitivity and high responding rate. Therefore, a scanner composed of the light receiving device based on the crystal semiconductor allows high speed reading. When the image sensor is made by using a crystal base semiconductor device, it is difficult to make it as a unit, and hence the crystal based semiconductor device (LSI chip) and circuit board are produced separately and then a plurality of the light receiving LSI chips are combined with a circuit board in a multichip method. In this way, a highly sensitive, a high speed reading type image sensor is manufactured. In this case, each LSI chip can be checked whether it is good or bad before it is assembled into a sensor device. Therefore, by selecting only good light receiving LSI chips, a circuit board for optical LSI chips can be checked before assembling, it becomes possible to increase the yield of the sensor thereby achieving the cost down thereof.

The present inventor et al. started study for further improving the image sensor. The present inventor et al. first studied the structure which allows a minimum clearance between LSI chips and a manuscript in order to realize a low output light source which is to be used for reading the manuscript. More particularly, as a transparent circuit board for mounting the LSI chips, the inventor et al. studied an extremely thin glass substrate of 0.1 mm or less in thickness, or studied to use a plastic film as a substrate. The LSI chip described here is of a bare chip type or has a pad made of gold or aluminum provided thereon as an external connection terminal.

Now, a circuit board having the base of a plastic film or a sheet will be described. Plastic is flexible, and an electrode can be formed easily with high productivity on the circuit board made of plastic by means of a spattering or a vacuum evaporation method while keeping the board in a low temperature. At present, circuit boards with the base made of a plastic film or a sheet are widely used in the part of the equipment subject to an extremely severe bend or needed to reduce its weight, but the use of circuit boards of this kind is expected to increase in a more wide area accompanying the progress of higher integration and further reduction in size and weight of the electronic equipment.

However, the present inventor et al. have found that since a circuit board composed of plastics is made of an insulation and tends to be charged, static electricity generated by friction is liable to accumulate on the surface thereby influencing the semiconductor device mounted on the circuit board. Practically, an error or disorder is generated in the output signal resultantly causing a noise or inducing an error motion in the circuit connected to this circuit board. When it is used in a contact type image sensor, and a manuscript and this circuit board rub together, the charge gives a serious influence. There is a stray or parasitic capacitance when the insulating layer is between two conductive layers. When optical semiconductor LSI chips are in the insulating layer, the capacitance will cause noise or crosstalk to the semiconductor LSI chips. The stray capacitance becomes great in the case of a longitudinal image sensor.

In the optical reader, light from a light source is irradiated onto a manuscript which is moving under a film-like transparent circuit board for reading the manuscript, while the light from the light source reflects in multipath between the manuscript and the circuit board. The present inventor et al. have also detected that inasmuch as the light receiving device for reading receives the multipath-reflected light thereby causing an error in the output signal of the light receiving device, sometimes reading is not correctly performed.

The argument similar to the above is also applicable to an optical image forming LSI chip which has a number of light emitting devices distributed for forming an image on a photosensitive matter by using light from these light emitting devices.

Further, with reference to a multichip type optical device circuit board having a plurality of reading LSI chips (light receiving LSI chips) or image forming LSI chips (light emitting LSI chips) mounted thereon, it is necessary to provide on the optical circuit board a number of electrodes to be used for one to one connection with these devices. Further, it is necessary to provide on or outside of the circuit board an input and output circuit for electrically activating these devices and receiving signals therefrom. Therefore, in this case, a skill is required for electrically connecting the input/output circuit and the optical device circuit board, and further the connection reliability is liable to be lowered. If the reading area is enlarged by using such as an image sensor, light receiving devices are needed additionally on the circuit board corresponding to the increased reading area resulting in the remarkable increase of electrodes on the board.

Therefore, in order to connect the light receiving LSI chips and the light emitting LSI chips in a manner of matrix wiring or the like, an aggregated circuit board is provided between the optical device circuit board and the input/output circuit. In this case, the connection may be performed such that the electrical connection between the optical device circuit board and the aggregated circuit board is first performed and then the aggregated electrodes on the aggregated circuit board and the input/output circuit are connected respectively. By providing the aggregated circuit board, the input/output circuit is allowed to access to aggregated electrodes of the number less than the number of the optical devices, and hence it becomes possible to activate an optional device or receive a signal from an optional device. However, the aggregated circuit board requires an additional cost for preparing thereof, and manpower is further needed for electrical connection between the optical device circuit board and the aggregated circuit board. When electro-optical devices are increased in numbers, practically the number of aggregated electrodes is increased approximately proportionally to the number of increased electro-optical devices. Therefore, a method which can provide this aggregated circuit board or aggregated electrode with low cost and high reliability is requested. It is also desired to prepare an optical device circuit board together having a function of the aggregated circuit board.

SUMMARY OF THE INVENTION

A first object of the present invention is to provide an optical circuit board having a function of an aggregated electrode thereby reducing the number of connections to be connected with external circuits.

A second object of the present invention is to provide an optical circuit board of high reliability in which thermal influence at the time of connection with external circuits is reduced to a minimum.

A third object of the present invention is to provide an optical circuit board which is prevented from being electrostatistically charged even when a manuscript and the circuit board rub together has no stray or parasitic capacitance, is protected from multipath reflection of light from a light source between the light source and the manuscript, and is capable of mounting a semiconductor device close to the surface of the optical circuit board.

A fourth object of the present invention is to provide an optical circuit board in which unnecessary light coming into a slit is reduced, the slit being provided in the optical circuit board for passing the light from the light source therethrough.

A fifth object of the present invention is to provide an optical circuit board in which an electrode and a semiconductor device mounted is connected with increased reliability.

A sixth object of the present invention is to provide an optical circuit board on which LSI chips can be easily mounted.

The first object of the present invention is achieved by an optical circuit board for mounting one or LSI chips for generating and/or detecting light which comprises a transparent substrate; a window portion formed as a slit-formed transparent area in the transparent substrate for transmitting the light which comes into and/or goes out of the LSI chip; a plurality of electrodes provided on a first primary surface of the transparent substrate at least on one side of the window portion along the longitudinal direction of the window portion corresponding to the above LSI chip respectively; a plurality of aggregated electrodes provided on a second primary surface, which being opposite to the first primary surface with reference to the transparent substrate, extending in the longitudinal direction of the window portion in an area corresponding to the above electrodes, respectively; an electrical connection portion which penetrates the transparent substrate; wherein each of the aggregated electrodes is electrically connected with a plurality of electrodes which are included in the above plurality of electrodes through the electrical connection portion, respectively.

An optical circuit board of the present invention will be described below. The optical circuit board of the present invention is applicable to various use, but representatively, to composing an image sensor of an optical reader by mounting one or more light receiving LSI chips, or a recording head of an optical image forming apparatus such as an optical printer by mounting one or more light emitting LSI chips.

In the present invention, the LSI chip means an electronic device having one or more light detecting cells, or one or more light emitting cells. Preferably, the LSI chip is an integrated circuit of these light receiving and/or emitting cells disposed on a semiconductor substrate. For example, a photo diode die, a photo diode array, a CCD (charge coupled device) image sensing device, an LED die, an LED array, an LD (laser diode) die, an LD array, or the like are used as the LSI chips of the present invention.

When the image sensor is composed by using the optical circuit board of the present invention, the light receiving LSI chip is bonded to an electrode on a first primary surface. In this case, it is preferable to use the light receiving LSI chip which has bumps for connection provided thereon. The light receiving LSI chip is disposed on the first primary surface side with its light receiving surface oriented toward a window portion. With reference to the image sensor, since it is usual to compose the image sensor for detecting the light irradiated from a light source and reflected on a manuscript, time image sensor is composed such that, wherein the manuscript is disposed on a second primary surface, the light from the light source enter the transparent substrate from the first primary surface side for penetrating the window portion, successively the light is reflected by the manuscript and again penetrates the window portion to enter the light receiving LSI chip. At this time, it is necessary to dispose the light receiving LSI chips carefully so that the light from the light source may come into the window portion without being influenced by the light receiving LSI chips. To be concrete, it is necessary to dispose the light receiving LSI chips so as not to cover all the space right over the window portion. Usually, since the manuscript and the image sensor are relatively moved for reading the image data on the manuscript, it is preferable to place the image sensor with the longitudinal direction of its window portion facing and crossing the direction of this relative movement.

When composing an image forming device such as the optical printer by using the optical circuit board of the present invention, the light emitting LSI chips are attached to the electrodes on the first primary surface so that the light emitting surfaces of the LSI chips are oriented toward the window portion. In this case, it is preferable to use the light emitting LSI chips which have connection bumps formed thereon. The light emitted from the light emitting LSI chips in response to the recording signal, penetrates the window portion to enter the surface of a photosensitive material disposed on the second primary surface side. Usually, although the photosensitive material is moved for recording relatively to the light emitting LSI chips, it is preferable to place the longitudinal direction of the window portion so as to cross the direction of the relative movement of the photosensitive material. If the photosensitive material is of a cylindrical form, the axis of rotation thereof should be placed parallel to the longitudinal direction of the window portion.

A transparent substrate to be used for the optical circuit board of the present invention is preferred to have high transparency with reference to the various light penetrating the window portion. The value of the transparency is usually at least not less than 70%, and preferably not less than 80%. As the base material for composing the transparent substrate, it is desirable to use a plastic film from a viewpoint of the following characteristics of the plastic film such as appropriate handling and processing facility, flexibility, possibility of continuous production, and thin film thickness which allows a small transmission distance between the manuscript and the light source, light reading LSI chips or light emitting LSI chips. As preferable base materials, there are, for example, plastic films made of polyester such as polyethyleneterephthalate (PET) or polyethylenenaphthalate (PEN), or plastic films made of homopolymer or copolymer such as polyamide, polyether, polysulfone, polyethersulfone (PES), polycarbonate, polyarylate, polyetherimide, polyetheretherketone (PEEK), polyimide, polyparabanic acid. Further, as to the film thickness, it is usually in the range of 5 to 500 μm, appropriately in the range of 10 to 100 μm, and preferably in the range of 20 to 50 μm. A glass having flexibility (such as a flexible glass) is also applicable to the present invention with the thickness as above in the same way as the plastic film.

In the present invention, a plurality of electrodes provided for being connected with the light receiving LSI chips and the light emitting LSI chips are arranged along the longitudinal direction of the window portion so that they do not intersect the light transmitting the window portion. In this case, they may be provided only on one side of the window portion or a plurality of electrodes may be provided on both sides of the window portion, respectively. As the material for composing the electrode, any material having conductivity, for example, metal or conductive resin, may be employed. However, as the material of the electrode, metals such as Au, Ag, Al, Ni, Cr, Cu and W each used as an ordinary material for the electrode is preferable, and from viewpoint of electrical characteristic, Cu is most preferable.

As a preferably further improved electrode, there is a laminated product composed of a first metal layer and a second metal layer. In the electrode of the laminated structure, the fist metal layer composes the main electrode and the second metal layer composes the part for use for press bonding or heat bonding of electronic parts such as a light receiving LSI chip. As other examples which are preferable, there are laminated electrodes such as the one having a first metal layer made to a low reflection layer, having a second metal layer made to a low reflection layer, having a first metal layer on the surface of which a low reflection layer is provided, having a first and a second layer on the surface of both layers low reflection layers are provided respectively. A low reflection layer will be described below.

As a forming method of the electrode or the metal layer composing the electrode of the present invention, there are various methods as follows: (1) Form a thin metal film composed of such as copper on the transparent substrate by means of a vacuum processing method such as a spattering or a vacuum evaporation method. Electroplating or electroless plating is applied, at need, to increase the thickness of the metal film prepared beforehand, or laminate a different metal on the metal thin film. (2) Provide a metal layer directly on the transparent substrate by means of electroless plating for forming an electrode. (3) Form an electrode by applying conductive ink directly on the transparent substrate. (4) Form an electrode by bonding a metal foil made of such as copper on the transparent substrate by means of an adhesive. (5) Cast the transparent resin on the metal foil made of such as copper. (6) Form an electrode by providing a conductive resin on the transparent substrate by printing or by a corresponding method thereto.

When a metal electrode or a metal layer is formed by a deposition method under a negative pressure or in the vacuum, it is preferable, in order to strengthen the degree of contact between the transparent substrate and the metal electrode or the metal layer, to use forming methods which use an ion technique such as a sputtering method, an ion plating method, an ion cluster beam method, an ionized evaporation method or an ion assist evaporation method. In order to increase the degree of contact between the metal electrode and the transparent substrate, or between the metal layer and the transparent substrate, an intermediate layer may be provided between the metal electrode and the transparent substrate or between the metal layer and the transparent substrate. As the intermediate layer, any material which increases the contact strength can be employed, there are, for example, a metal or a metal compound including such as Ni, Cr, or resin.

In the present invention, as a method for forming a metal electrode on the first primary surface of the transparent substrate, there is a method for forming a metal electrode of a predetermined size on the first primary surface by using a mask or the like, or a method for forming a metal film on whole the first primary surface and subsequently apply etching to form the metal of a pattern of a fixed size. A method of processing and forming a pattern of the metal electrode will be described in concrete. There are methods as follows: (1) By using a resist or a mask, first cover the portion of the first primary surface which is not the portion of a metal electrode, and thereafter directly form the metal electrode which has a predetermined circuit pattern, and after forming the pattern, the resist and mask are removed. (2) On the metal film formed on the whole area of the first primary surface, form a predetermined pattern of the metal electrode by using a resist to protect the metal film, thereafter remove the unnecessary metal film by etching and finally remove the resist. (3) On the metal film formed on the whole area of the first primary surface, form a mask with such as a resist covering the portion of the metal film exclusive of the metal electrode area. Then increase the thickness of the metal film by electroplating to form the metal electrode of a predetermined pattern. Subsequently remove the resist and apply flash etching to further remove the unnecessary metal film while keeping the metal electrode portion remained on the metal film.

If the metal electrode is of a laminated structure composed of a first and second metal layers, there are processing and forming methods with reference to the pattern of metal electrodes, in concrete, as follows: (1) On the first metal layer formed on the whole area of the first primary surface, form a predetermined pattern of the metal electrode with a resist to coat the first metal layer, subsequently process the unnecessary portion of the first metal layer by etching and then remove the resist. It is acceptable to form a second metal layer on the first metal layer. (2) On the first metal layer formed on the whole area of the first primary surface, form a mask with such as a resist covering the portion of the metal film exclusive of the metal electrode area. Then increase the thickness of the metal layer by electroplating or electroless plating or laminating a different metal on the metal layer, to form the metal electrode of a predetermined pattern. Subsequently remove the resist and apply flash etching to further remove the unnecessary portion of the first metal layer while keeping the metal electrode portion remained on the metal layer. According to cases, it is allowable to form a second metal layer on the above metal electrode, then remove a resist, and further apply flash etching thereto, remove unnecessary metal film keeping the metal electrode portion remained, thereby forming a metal electrode pattern having a second metal layer. (3) On the first metal layer formed on the whole area of the first primary surface, form a mask with such as a resist covering the portion of the metal film exclusive of the metal electrode area of a predetermined pattern. Subsequently, after forming a second metal layer, remove a resist, and further applying flash etching thereto, form the metal electrode by removing the portion other than the metal electrode portion. (4) Form a metal film of a laminated structure composed of a first and second metal layers on the whole area of the first primary surface, subsequently form a mask with such as a resist on the second metal layer covering the metal electrode portion of a predetermined pattern, then apply etching thereto for removing the metal layer exclusive of the metal electrode and further remove the resist to form the metal electrode. (5) It is practical to form metal layers consisting of a low reflection layer, a first metal layer and a second metal layer on the whole area of the first and second primary surfaces, then form a mask with, such as, a resist on the second metal layer of an area of a predetermined pattern, successively apply etching thereto, remove the resist to form patterns of a plurality of metal electrodes, a plurality of aggregated electrodes, a shading layer and an antistatic layer.

When the electrode of the present invention is made to a laminated structure consisting of a first and second metal layers, it is preferable to comprise the second metal layer, as described above, to which electric parts can be press bonded or heat bonded. The second metal layer of this type can be formed by a vacuum processing method such as a spattering method, but preferably, it is formed by gold plating, solder plating or printing. When, for example, a gold plating layer is used as the second metal layer, this gold plating layer may be formed by various methods as follows: (1) An electroplating method in the alkali cyanide bath. (2) An electroplating method in the neutral or weak alkali bath. (3) A usual gold plating method in such as a weak acid bath using an organic acid. Appropriate thickness of the gold plating layer is usually in the range of 0.05 μm to 80 μm, preferably in the range of 0.1 μm to 50 μm, more desirably in the range of 0.5 μm to 50 μm and, most desirably in the range of 0.1 μm to 5 μm.

When a solder plating layer is used as the second metal layer, this solder plating layer may be formed by a few methods as follows, that is, by (1) An electroplating method in such as the bolofluoric acid bath, phenol sulfonate bath or alkanol sulfonate bath. (2) An electroless plating such as a substitution plating method or a reduction precipitation method. (3) A solder paste printing method printing solder paste such as creamy solder by a screen printing method. The thickness of the solder plating layer is usually in the range of 0.05 μm to 80 μm, preferably in the range of 0.5 μm to 50 μm, more desirably in the range of 2 μm to 10 μm. In the present invention, solder means a metal or an alloy of a low melting point which is used for bonding materials. This kind of metal or alloy has a melting point particularly lower than 723K absolute temperature including, for example, a simple substance or an alloy of In, Sn, Pb or Zn. As the solder commonly used, there is Sn-Pb alloy which forms eutectic solder. In addition to the above, there are Homberg's alloy, Mellotte's ally, Newton's alloy, D'Arcet's metal, Lichtenberg's alloy, Crose's alloy, Rose's metal, Wood's metal, Lipowitz's metal, low melting point solder, alkaliproof solder, eutectic solder, JIS(Japanese Industrial Standard) solder, thermo-electromotive force small solder and aluminum solder or the like. Further, alloys other than the named alloys but are usable for bonding can be used as the second metal layer.

When forming a solder layer by a plating method or a printing method without using a melted solder bath which is of relatively high temperature, the second metal layer can be formed with high reliability, even in the case a plastic film of relatively low thermal resistance is used as a transparent substrate, not to speak of the case in which a substrate of high thermal resistance is used as the transparent substrate. Accordingly, electrical connection between a semiconductor device such as a light receiving LSI chip and an electrode can be performed by means of a method of high connection reliability which employs the solder.

In the optical circuit board of the present invention, a plurality of aggregated electrodes are arranged on the second primary surface. In this Specification, a common electrode on the second primary surface is called as "an aggregated electrode." This aggregated electrode is used for relaying signal or data between optical devices such as a light receiving LSI chip or a light emitting LSI chip and another circuit board or another electronic circuit, and which serves to connect these optical devices for being electrically equivalent in a connection arrangement such as matrix connection. Each aggregated electrode is provided as a common electrode for a plurality of optical devices, respectively. The material and forming method with reference to the above electrode, particularly to the metal electrode are applied without change to the material and forming method of the aggregated electrode. The electrode on the first primary surface and the aggregated electrode are connected by means of an electrical connection portion penetrating the transparent substrate. The electrical connection portion will be described below.

Electrical connection between an aggregated electrode and other circuit board or electronic circuit can be effected by connecting one end of a connection lead wire to the aggregated electrode, however, it is preferable to provide an external connection terminal electrically connected on the aggregated electrode and connect one end of the connection lead wire to this external connection terminal. Further, it is possible to use the external connection terminal as a bump area for directly bonding to a bump which is provided on the external circuit board. The external connection terminal can be provided on any of the first and second primary surfaces. If the external connection terminal is provided on the first primary surface, it can be of the same structure as the electrode for the optical LSI chip, and can be connected with the aggregated electrode by means of the electrical connection portion penetrating the transparent substrate. On the other hand, when the external connection terminal is provided on the second primary surface, it can be formed as a pad area connected with the aggregated electrode. By providing the external connection terminal, a heat affected zone which receives the heat produced by the electrical connection between the external circuit and the optical circuit board can be limited within a neighborhood of the external connection terminal, thereby preventing the thermal heat spreading over the whole circuit board. Therefore, high temperature solder can be used for bonding even when a transparent substrate of low heat resistance is used.

Further, with reference to electrodes which are a part of a number of electrodes formed on the first primary surface, they can be connected in common to a common electrode (in this Specification, a common electrode on the first primary surface is called just as "a common electrode.") provided on the first primary surface without connecting to the aggregated electrode provided on the second primary surface. The structure of this common electrode is similar to the aggregated electrode exclusive of being provided on the first primary surface. The electrodes for optical devices and the common electrode are connected by a circuit pattern which is formed on the first primary surface. It is also possible to form an external connection terminal at the end of the common terminal. The electrode, common electrode and a circuit pattern for connecting them can be formed at the same time on the first primary surface.

An electrical connection portion to be used for electrically connecting the electrode or external connection terminal on the first primary surface and the aggregated electrode on the second primary surface will be described below. The electrical connection portion forming methods are such that: (1) A penetration hole is formed in the transparent substrate by mechanically processing the substrate by using a drill or a laser, and then coating the hole with a metal film produced inside the hole by applying electroless plating for completing the electrical connection. The electrodes or external connection terminal on the first primary surface and the aggregated electrode are electrically connected with this electrical connection portion. (2) A penetration hole is formed in the transparent substrate by using the solution such as acid, an alkali or an organic solvent and then apply electroless plating to the hole for coating the inside of the hole with a metal film for completing the electrical connection portion. Between the electrode or the external connection terminal and the aggregated electrode are connected with this metal film. (3) Apply a mechanical force such as compressing the electrode on the first primary surface and the aggregated electrode on the second primary surface from both outsides thereof and concurrently applying heat thereto for electrically connecting both two electrodes. (4) As the case (3) above, apply a mechanical force between both two electrodes and electrically connecting them. (5) As the case (3) above, apply a mechanical force between both two electrodes and concurrently applying a voltage between both two electrodes for electrically connecting them by the generated Joule heat (resistance welding). And further, (6) form a penetrated hole in the transparent substrate by mechanically processing with a drill or a laser and by filling conductive resin or conductive paste inside the hole to provide an electrical connection. In the case of (6), the electrode or external connection terminal on the first primary surface and the aggregated electrode on the second primary surface can be electrically connected through conductive resin or conductive paste. At this time, the conductivity of such as the conductive paste is improved by burning, and together with which the bonding strength of the paste is also increased.

In the present invention, if the electrode or aggregated electrode is composed with metal, a low reflection layer may be provided in order to protect against the multipath reflection of light due to the reflection on the surface of the metal. The low reflection layer may serve in parallel as an electrode or may be provided between the electrode and the transparent substrate. If the electrode is of a laminated structure consisting of a first and a second metal layer, a low reflection layer may serve as the first metal layer or the second metal layer, or may be provided between the first metal layer and the transparent substrate, or further may be provided on the second metal layer.

The visible light reflectance of the low reflection layer is expected to be not more than 50%, but preferably not more than 10%, and the most desirable is not more than 5%. As materials which are suitable for composing the low reflection layer, there are, for example, metals such as Ge, Si, Sn, W and solder; oxides of such as Cr, Cu, Fe, In, Mn, Ni, Pb, Pd, Pt, Ti, V and W; carbides of such as B, W; nitrides of such as Cr, Zr; sulfides of such as Ni, Pb, Pd and Cu; and a phosphorus compound of such as Fe, and the mixture thereof. Further, it is possible to use a metal or a metal compound whose surface reflectance is reduced by applying a dying-black treatment or an unevenness treatment, and also a combination of the above treatments. Here, the dying-black treatment means the treatment in which the metal surface is treated to form a layer of low light reflectance. As the method of dying-black treatment, there are, for example, a method which uses a black dye on the market such as Ebonel made by Mertech Inc., or a method forming a layer of the metal oxide or the metal sulfide on the metal layer according to the method disclosed in the Japanese Laid-open Publication 41378/82 (JP, A, 57-41378) and 47375/88 (JP, A, 63-47375). Further, it is acceptable to use setting type resin including carbon black or a color pigment as a resist to be used for forming a metal electrode, and this setting type resin may also be used as a low reflection layer without removing thereof even after etching treatment for forming a pattern of the metal electrode is finished.

In the present invention, it is preferable to provide a shading layer for controlling the light so as not to penetrate the transparent substrate through the portion other than a window portion. The shading layer defines the window portion being formed on the transparent substrate along the window portion and covering the portion other than the window portion. If the shading layer is additionally formed on the electrode which is prepared as a pattern for connecting devices such as a light receiving LSI chip or wiring, the shading effect is further increased. This shading layer can be provided on any of the first and second primary surfaces. However, when it is provided on the second primary surface, as described later, an antistatic layer should also have the function of the shading layer combined with its own duty and it is preferable not to provide an individual shading layer separately. With reference to the light to be used for reading or forming an image, the allowable light transmittance of the shading layer is not more than 50%, preferably not more than 10%, and the best is not more than 5%. A low reflection layer may be provided between the shading layer and the transparent substrate for the purpose of preventing multipath reflection. This low reflection layer is of the same nature as the above low reflection layer provided on the electrode, and may be produced in the same manner as above.

A method for forming a shading layer is as follows: (1) Laminate a low reflection layer made of such as a black chrome-plated metal layer or oxidized copper into a metal layer to form a shading layer. (2) Disperse a conductive filler comprising such as carbon black and/or a metal particle such as platinum black into a resin matrix to form a layer which constitutes a shading layer. (3) Form a film by dispersing such as pigment or dye into resin to make a shading layer. (4) Laminate resin which has light absorption property of its own such as polythiophene on the transparent substrate to form a shading layer.

The allowable thickness of the shading layer is normally in the range of 0.05 μm to 50 μm, preferably in the range of 1 μm to 10 μm, and most desirable is in the range of 2 μm to 5 μm.

As described below, when the antistatic layer is formed on the second primary surface side, a shading layer on the first primary surface is formed opposite to the antistatic layer. Consequently, the shading layer cooperate with the antistatic layer to prevent the inappropriate light which enters the window portion more effectively, the inappropriate light being not the practical light for read or write. In this case, the shading layer must be formed so as not to affect the electrical signal which is generated at the time of reading a manuscript or the light goes to a photosensitive matter at the time of image forming, and hence it is preferable to form the shading layer with the resin comprising low-conductive pigment or dye. The shading layer on the first primary surface and the antistatic layer on the second primary surface together define the window portion for use for transmitting only the light for reading a manuscript or the light for forming an image. The window portion to be defined as a blank area of the shading layer usually has a straight slit form with the slit width being normally in the range of 0.1 mm to 50 mm, preferably in the range of 0.3 mm to 2 mm.

In the present invention, the antistatic layer for preventing the optical circuit board from being charged can be provided on the second primary surface. Particularly, when the circuit board is used in a contact type image sensor or the like in which the circuit board rub together with a manuscript or a photosensitive matter, it is desirable to provide the antistatic layer for controlling the state being charged due to friction static. When the antistatic layer is provided, it is desirable to be provided with the structure which prevents the circuit board from being charged while having a light-shielding property thereby cooperating with the shading layer for defining the window portion. The allowable light transmittance of this kind of antistatic layer for the wavelength of the light for read or write is not more than 50 %, but preferably not more than 10%, and further desirably not more than 5%.

It is acceptable to provide a low reflection layer the same as above between the transparent substrate and the antistatic layer.

In order to define the window portion, it is desirable the antistatic layer has a shape including a slit-form opening which corresponds to the window portion. The opening usually has a straight form and the width of the slit is normally in the range of 0.1 mm to 50 mm, preferably in the range of 0.3 mm to 2 mm. The thickness of the antistatic layer is generally in the range of 0.05 μm to 50 μm, preferably in the range of 1 μm to 10 μm, and the best is in the range of 2μ to 5 μm.

The opening provided in the antistatic layer is preferably disposed corresponding to an area between the electrode and the shading layer formed on the first primary surface of the transparent substrate. The width of the antistatic layer itself is not restricted, but preferably it is equal to or more than the width of the slit of the window portion. Specifically, the width of the antistatic layer is preferably twice the width of the window portion, and a more desirable value is approximately five times thereof. The width of the antistatic layer may be made equal on both sides of the window. However, in order to reduce the influence of the electro-static charge to the LSI chips such as the light receiving LSI chips, it is preferable to make the width on the side corresponding to the device larger. In concrete, the width of the antistatic layer with reference to the window on the side corresponding to the LSI chip is in the range of 2 mm to 100 mm, preferably in the range of 3 mm to 10 mm.

As a method for forming the antistatic layer on the second primary surface of the transparent substrate, there are some methods as follows: (1) Form an antistatic layer by applying plating such as black chrome plating or black chromating treatment to the second primary surface; (2) Form an antistatic layer by dispersing conductive fillers such as carbon black and/or metal particles (i.e.. platinum black) into a resin matrix and then printing and setting thereof; (3) Form an antistatic layer by forming a metal layer or a metal layer with a low reflection layer, and subsequently etching thereof.

Further, if the transparent substrate to be used is of high heat resistance, the antistatic layer may be formed by a general method utilizing techniques such as plating, evaporation, thermal spraying, heating after coating, or the like. When the resin with poor heat resistance such as PET, polycarbonate, PES are used, in order to avoid the deformation of the transparent substrate due to the heat generated at the time of forming the antistatic layer, the temperature of forming the antistatic layer is preferably not more than 150° C., more preferably not more than 120° C., most desirably not more than 100° C. Higher forming temperatures may be also applicable in some cases.

As a method of manufacturing the antistatic layer in the relatively low temperature, there are some methods as follows: (1) Disperse a conductive filler such as carbon black beforehand in a one-part setting type epoxy resin to print this resin into a form having an opening, and subsequently heat this resin to the predetermined temperature and let it set to form an antistatic film. This one-part setting type epoxy resin includes microcapsules to be decomposed at a fixed temperature being dispersed therein, the microcapsule comprising a catalyst for reacting with the base resin for producing the curing reaction. (2) Use the resin comprising a curing agent dispersed therein and decomposed at a fixed temperature to react with the base resin and to be cured by the reaction. Disperse the conductive filler such as carbon black into the resin for printing the resin to a form containing an opening. Subsequently, heating this resin to a predetermined temperature and let it set to form the antistatic film.

In order to increase the antistatic effect, it is possible to provide an earth electrode in the antistatic layer for grounding this earth electrode.

The material and forming method with reference to the electrode, particularly to the metal electrode are applied without change to the material and forming method of the aggregated electrode, the antistatic layer, the external connection terminal, and the shading layer which is provided on the first primary surface in opposite relationship to the metal electrodes.

In the present invention, a light guide may be provided in the second primary surface of the transparent substrate for introducing the light from an object to the window portion or the light emitted from the window portion to the object. Here, the object means a manuscript placed in an optical reader or a photosensitive matter placed in an optical image forming apparatus. Any matter having a function for condensing or guiding the light can be used as the light guide. As preferable light guides, there are lenses such as Selfoc™ lens or an optical fiber array composed of a number of glass fibers or plastic optical fibers bundled. The rod lens array or optical fiber array on the second primary surface of the optical circuit board may preferably be used in the case of a circuit board without the antistatic layer.

The optical circuit board according to the present invention having the structure as described above can exert its function sufficiently without any assistance or modification. However, in order to prolong the life of the product which uses this optical circuit board, it is desirable to provide a protect layer on the outermost surface of the second primary surface for increasing the friction tolerance thereof. The protection layer is formed by bonding a glass plate onto the second primary surface or by coating such as UV-setting type acryl resin, silicon hard coat agent or silica sol agent. It is desirable to provide this protection layer particularly in a manner such that the protection layer completely covers the antistatic layer. The thickness of the protection layer is in the range of 1 µm to 200 µm, preferably in the range of 2 µm to 100 µm, more desirably in the range of 5 µm to 20 µm.

Further, in order to increase the durability of electrical connection between the optical circuit board of the present invention and optical LSI chips disposed on the circuit board, it is practical to cover the whole LSI chips or to fill the area between the optical circuit board and the optical LSI chips by using setting or curing type resin. As examples of the setting type resin, there are UV setting resin represented by the acryl-base UV setting resin, the thermosetting resin represented by such as silicon acrylate, epoxy-base room temperature curing resin and mixtures of the above.

The above and other objects, features and advantages of the present invention will become apparent from following description referring to the accompanying drawings which illustrate examples of preferred embodiments of the present invention.

BRIEF DESCRIPTION OF THE INVENTION

DESCRIPTION OF THE PREFERRED EMBODIMENTS

The present invention will be described in detail below with reference to the drawings.

The optical circuit board of the present invention can be used, as described above, for composing an image sensor of an optical reader by mounting a light receiving LSI chip, or as a recording head of an optical image forming apparatus such as a light printer by mounting a light emitting LSI chip. The optical circuit board of the present invention used as the image sensor of the optical reader will first be described with reference to FIG. 2.

Figure 2:
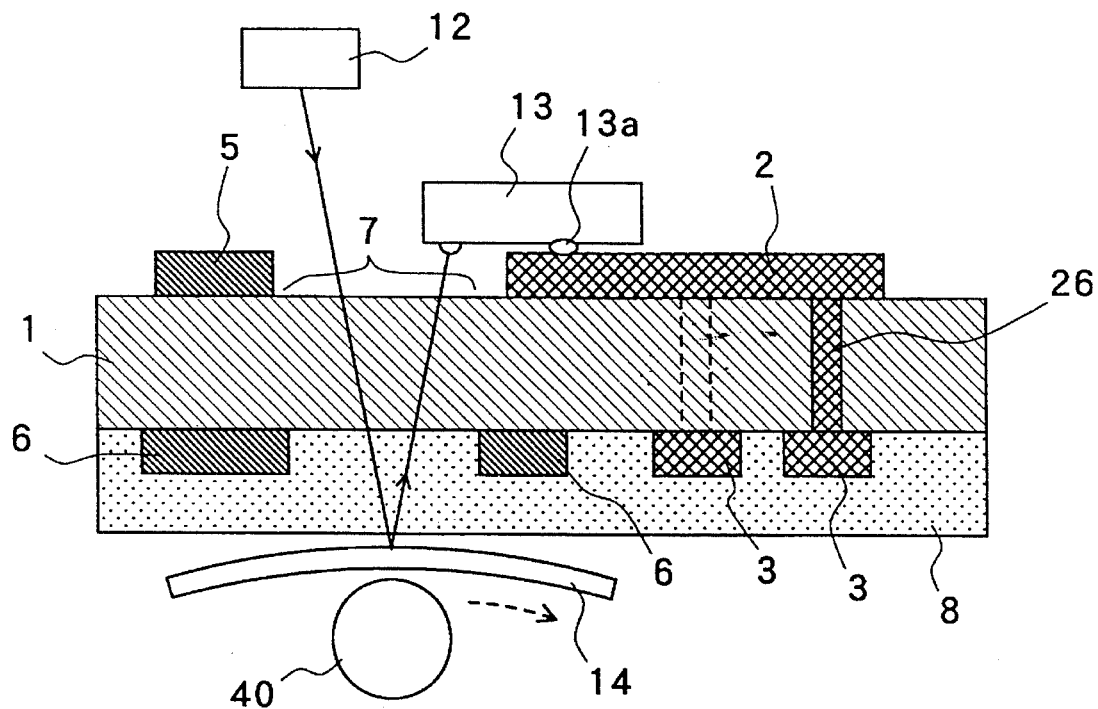
FIG. 2 is a cross sectional view typically showing an optical circuit board according to the present invention used in an image sensor.

The optical circuit board of the present invention is basically composed by using a film-like transparent substrate 1 which has a slit-shaped window portion 7 provided so that the light can be transmitted only through this window portion. The circuit board further comprises a plurality of metal electrodes 2 to be used for connecting with light receiving LSI chips 13 being disposed on a first primary surface along the window portion 7, a plurality of aggregated electrodes 3 provided on a second primary surface opposite to the first primary surface in the transparent substrate 1 extending in the longitudinal direction along the window portion 7, wherein the aggregated electrode 3 and the metal electrode 2 are electrically connected by means of a connection part 26 which penetrates the transparent substrate 1, and the metal electrodes 2 are disposed in such a manner not to prevent the transmission of light through the window portion. In FIG. 2, the direction of arrangement of the metal electrodes 2, that is, the longitudinal direction of the window portion 7 or the aggregated electrodes 3 are perpendicular to the surface including the figure. The aggregated electrodes 3 are disposed corresponding to the disposition area of the metal electrodes 2.

Further, the optical circuit board includes a shading layer 5 which defines the window portion 7 and disposed on the first primary surface opposite to the metal electrodes 2 interposing the window portion 7. The shading layer 5 also extends in the longitudinal direction of the window portion 7, and a slit-formed opening between the shading layer 5 and each metal electrode 2 practically constitutes an exposed area of the window portion 7 on the first primary surface. It is preferable to provide the shading layer also on the space between each metal electrode. The shading layer which is provided on the space between each metal electrode must be made of a material with a good insulation performance. The second primary surface comprises an antistatic layer 6 of good conductivity and light shading property. The antistatic layer 6 has a slit-formed opening which corresponds to the window portion 7. The antistatic layer 6 prevents the circuit board from being charged by such as friction static and at the same time functions for defining the window portion 7 on the second primary surface. A transparent protection layer 8 is provided in such a manner to cover the second primary surface including the antistatic layer 6 and the aggregated electrode 3 provided thereon. Here, lenses including such as a Selfoc™ lens or a light guide such as a glass fiber array which guides light may also be used instead of the antistatic layer.

When the optical circuit board is applied in an optical reader into which image data of one picture is inputted by the relative movement of a manuscript and an image sensor, the optical circuit board is disposed in the optical reader in such a way that the longitudinal direction of the window portion 7 traverses the direction of movement of the manuscript 14 while having the second primary surface facing the manuscript 14. In this case, the light from the light source 12 for reading the manuscript is led into the transparent substrate 1 from the first primary surface side, and transmitted through the window portion 7 for being irradiated to the manuscript 14, then reflected according to the image pattern on the manuscript, and again transmitted through the window portion 7 to enter the light receiving LSI chip 13 connected to the metal electrode 2. The light receiving LSI chip 13 and the metal electrode 2 are bonded with each other by means of a connecting bump 13a of the LSI chip 13. The manuscript 14 is carried in the right-left direction of the figure by means of a conveying roller 40.

When the optical circuit board of the present invention is used in the optical image forming apparatus such as a photo-printer, in order to meet the case, the light emitting LSI chip may be attached, instead of the light receiving LSI chip 13, to the electrode 2 with its light emitting surface oriented toward the window portion 7, and the second primary surface of the transparent substrate may be placed opposite to the photosensitive surface of the photosensitive matter. In addition to the above manuscript moving type, it is possible to apply whichever system in which the photosensitive matter is moved or the optical circuit board itself is moved. These moving system only show the relative relation between the objects and theoretically equivalent to each other.

Figure 3A:
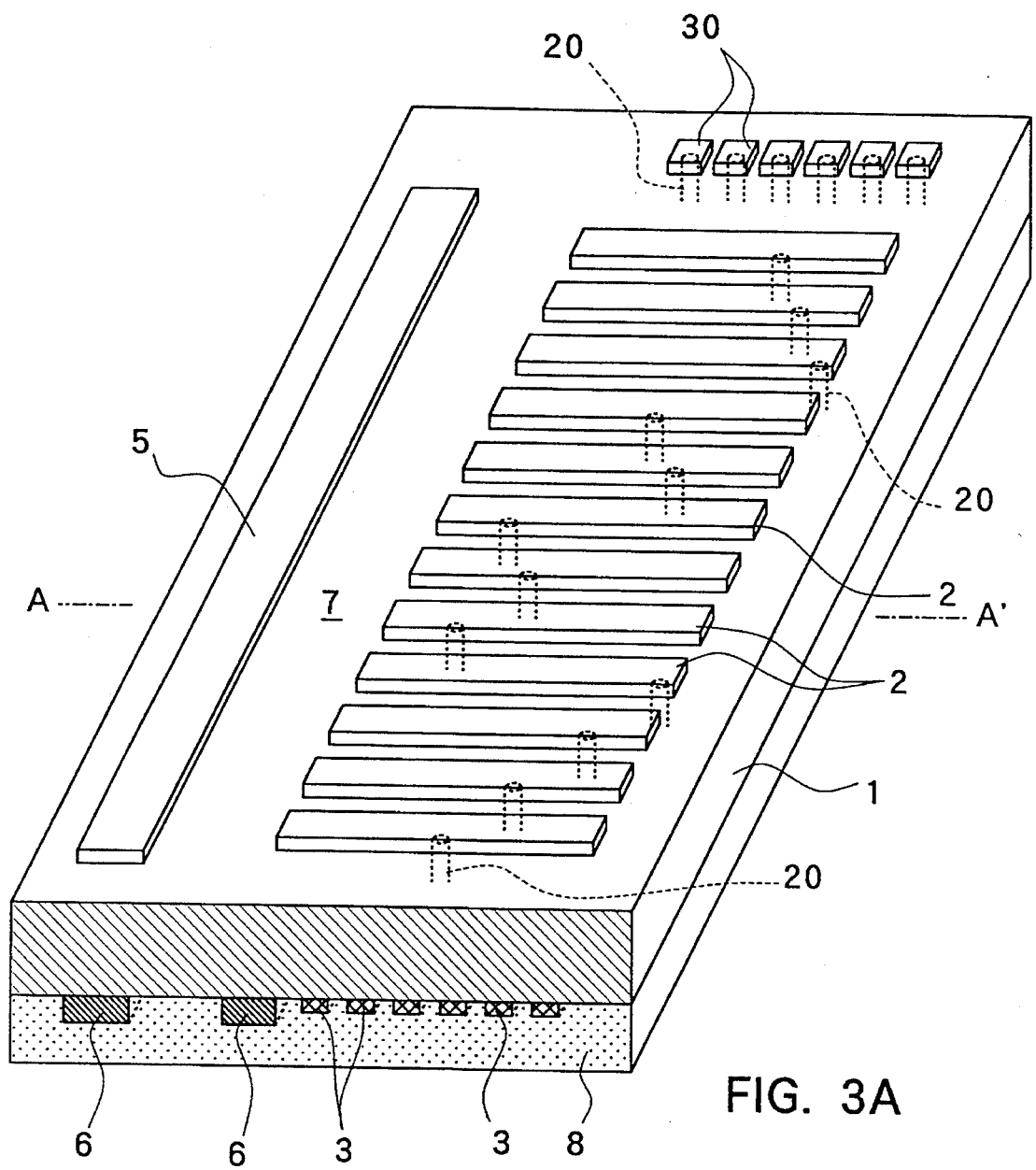
FIG. 3A is an oblique view showing an optical circuit board of a first embodiment of the present invention.

The optical circuit board of the present invention will further be described with reference to its embodiments. FIG. 3A shows an optical circuit board of a first embodiment.

In FIG. 3A, on the first primary surface (upper surface of the figure) of the film-like transparent substrate 1, a shading layer 5 is provided on one side and a plurality of metal electrodes 2 are provided on the other side interposing an area which is a slit-formed window portion 7. The shading layer 5 and the metal electrode 2 together define the area of the window portion 7. Each metal electrode 2 having a form of a strip of paper is arranged with its longitudinal direction being perpendicular to the longitudinal direction of the window portion 7. When this optical circuit board is applied to the optical reader, the optical circuit board is mounted on the optical reader such that the longitudinal direction of the window portion 7 will traverse the direction of the relative movement of the manuscript and the circuit board.

Figure 3B:
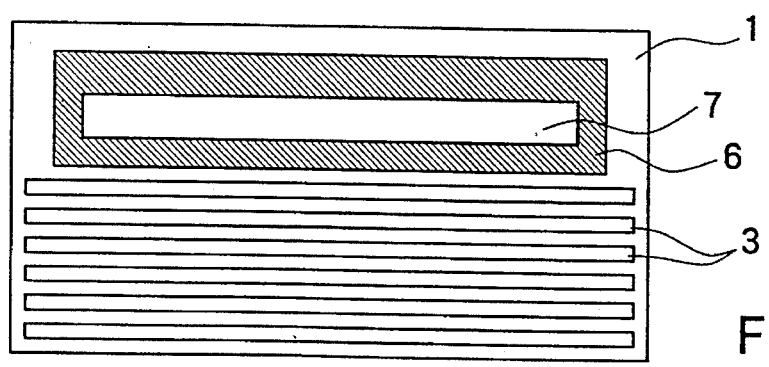
FIGS. 3B and 3C are plans each showing an example of arrangement of an antistatic layer of a first embodiment.
Figure 3C:
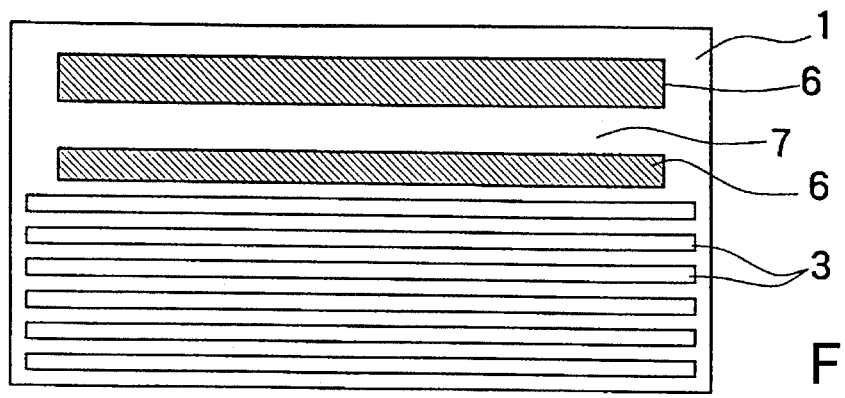

While on the second primary surface (lower surface of the figure) of the transparent substrate, that is, on the primary surface opposite to the first primary surface, a plurality of the aggregated electrodes 3 are provided so as to be in parallel relationship with the area of the first primary surface on which the metal electrodes 2 are provided. Each aggregated electrode 3 has a long ribbon-like form longer than the longitudinal size of the window portion 7. Further on the second primary surface, there is provided an antistatic layer 6 composed of a material having a light shielding property and electric conductivity. As shown in FIG. 3B, the antistatic layer 6 is made into a form of a rectangle with an opening made by cutting out the area corresponding to the window portion 7, that is, a form composed of sides of rectangles. Besides, as shown in FIG. 3C, the antistatic layer 6 may be provided as two ribbon-like layers arranged on both sides of the window portion 7. A transparent protection layer 8 is provided in a manner to cover the whole area of the second primary surface, the aggregated electrodes 3 and the antistatic layer 6.

Now, the positional relationship will be described with reference to the metal electrode 2 and the shading layer 5 both on the first primary surface and the antistatic layer 6 on the second primary surface. These matters substantially define the region of the window portion 7, respectively. However, the edge of the metal electrode 2 and the shading layer 5 may be positioned being coincident with the edge of the opening of the antistatic layer 6, or may slightly project over the edge into the opening of the antistatic layer 6 so far as it does not prevent the light being transmitted through the window portion 7. Further, with reference to the size of the region to be secured as the window portion 7 on the first primary surface, that is, the size of the region enclosed by the metal electrode 2 and the shading layer 5, and the size of the opening of the antistatic layer 6, they can be different insofar as the common area is formed for transmitting the light.

With reference to the first primary surface, it is noticed that external connection terminals 30 of the same number as the number of aggregated electrodes 3 are provided thereon in the area corresponding to one end of the aggregated electrode 3 together being the periphery of the optical circuit board. Each of external connection terminals 30 has a pad-like form to be used for connection with the external circuit, and electrically one to one connected with the aggregated electrode 3 through an electrical connection portion 20 which is provided so as to penetrate the transparent substrate 1.

Figure 3D:
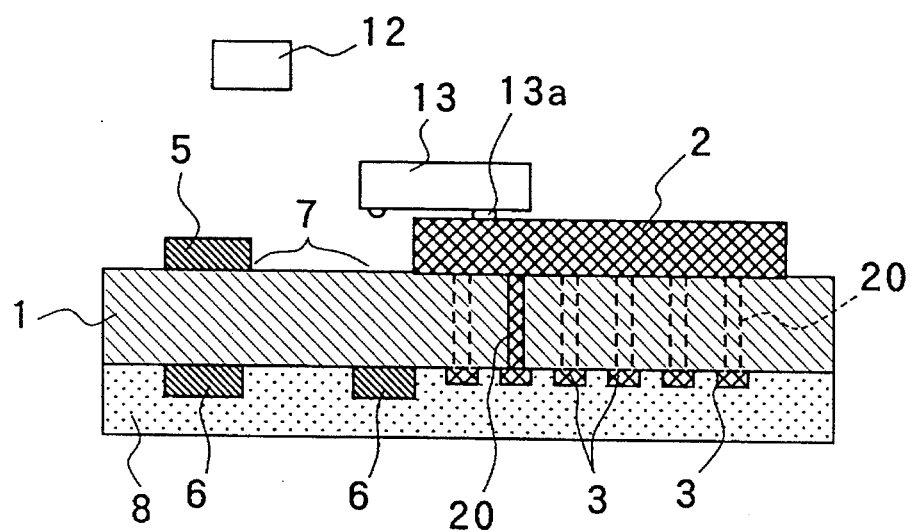
FIG. 3D is a typical cross sectional view taken along the line A—A' of FIG. 3A.
Figure 3E:
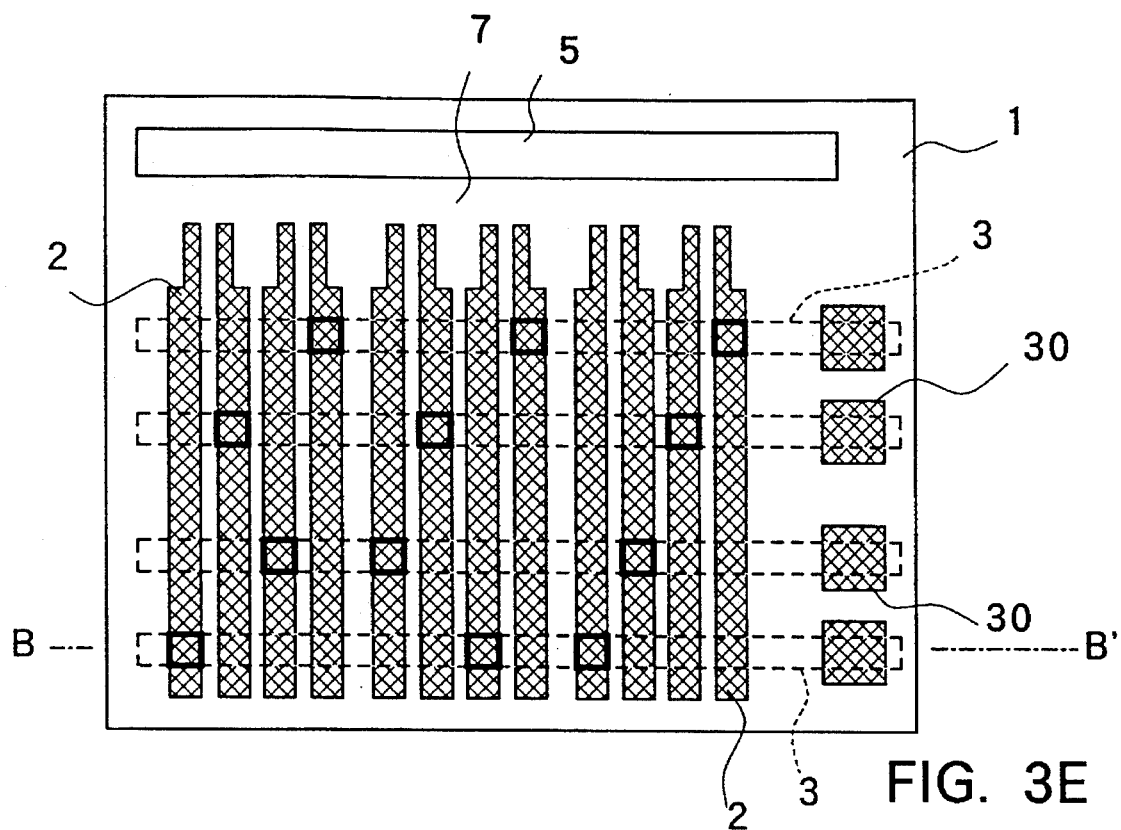
FIG. 3E is a typical plan view of an optical circuit board shown in FIG. 3A.
Figure 3F:
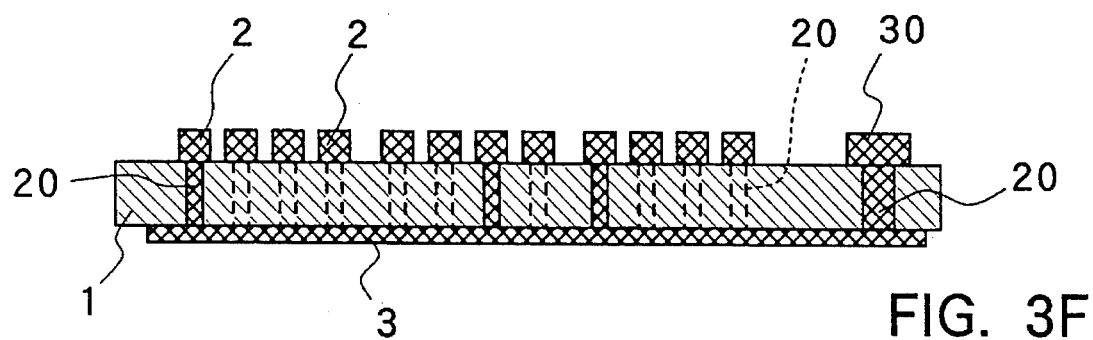
FIG. 3F is a typical cross sectional view taken along the line B—B' of FIG. 3E.
Figure 3G:
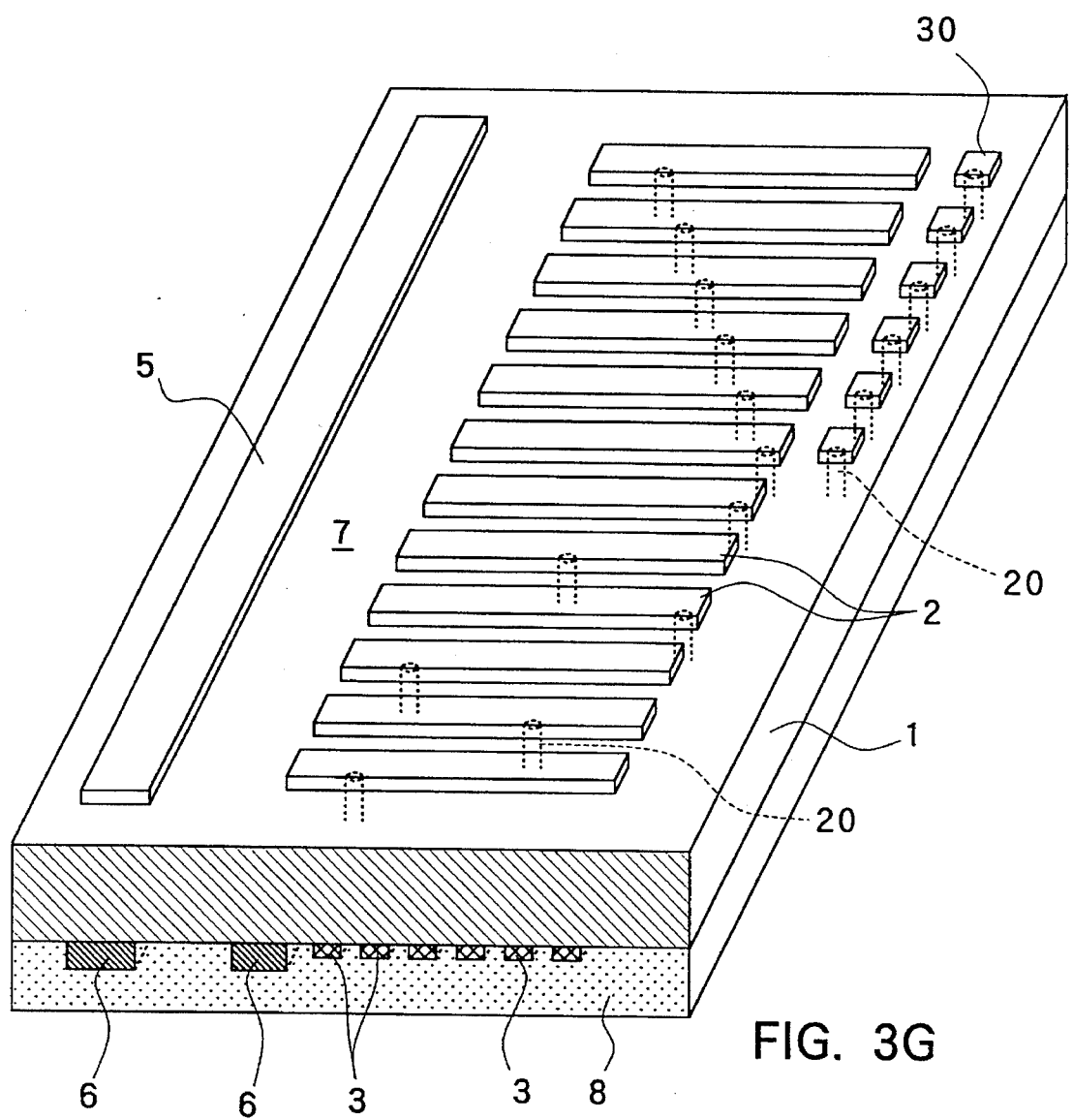
FIG. 3G is an oblique view showing an example of another arrangement of external connection terminals of a first embodiment.

Each metal electrode 2 is electrically connected with each one of aggregated electrodes 30 through the electrical connection portion 20. A cross sectional view shown in FIG. 3D illustrates how the both electrodes are connected through the electrical connection portion 20. FIG. 3D also illustrates a light source 12 and a light receiving LSI chip 13 as an image sensor. The light receiving LSI chip 13 and the electrode 2 are bonded with each other by means of a connection bump 13a provided in the light receiving LSI chip 13. Each electrode 2 can optionally select the aggregated electrode 3 as a connection partner. However, inasmuch as the aggregated electrode 3 is provided for matrix connection of such as light receiving devices, the person skilled in the art can easily understand that what style of combination is desirable with reference to combination of connection of the metal electrode 2 and the aggregated electrode 3. Further, it is possible to connect the electrodes 2 with the aggregated electrodes 3 in a manner such that the arbitrary one of light receiving LSI chips 13 can be selected by selecting two of the aggregated electrodes 3. FIG. 3E typically illustrates the positional relationship between each metal electrode 2 and each aggregated electrode 3 viewed from the first primary surface side. In this figure, each part in which the metal electrode 2 and the aggregated electrode 3 are shown overlapped and enclosed with thick lines gives the position whereat the metal electrode 2 and the aggregated electrode 3 are practically connected. Also in this figure, there is illustrated that the metal electrodes 2 are coupled to a pair, and on the side of the window portion 7, the top of each electrode of the pair has a symmetrical form with each other for easy mounting of the light receiving LSI chip or the light emitting LSI chip. FIG. 3F is a typical cross sectional view corresponding to FIG. 3E.

Although the first embodiment has been described above, there may be various kinds of modifications. In the optical circuit board shown in FIG. 3E, the external connection terminals 30 are provided as a group at the opposite side of the window portion 7 beyond the metal electrode 2 disposed therebetween. In this case, by changing the form of the aggregated electrode 3 on the second primary surface into a form of a character L, the aggregated electrode 3 and the external connection terminal 30 can be connected by means of the electrical connection portion 20 penetrating the transparent substrate 1.

If the antistatic layer 6 can provide a sufficient light shading effect, it is possible to construct the circuit board without providing the shading layer on the first primary surface.

As for the light receiving LSI chip or the light emitting LSI chip, it is allowable to use a LSI chip having a plurality of bumps, or use a long size array type LSI chip having a plurality of electronic devices provided thereon. While, for the case in which an array type LSI chip is used, metal electrodes are allotted to the LSI chips by the number of bumps provided in the LSI chips and used for the electrical and mechanical support. In the optical circuit board of the present invention, since a number of metal electrodes can be disposed along the window, it can conveniently increase the mechanical supporting points with reference to the array type LSI chip.

Figure 4:
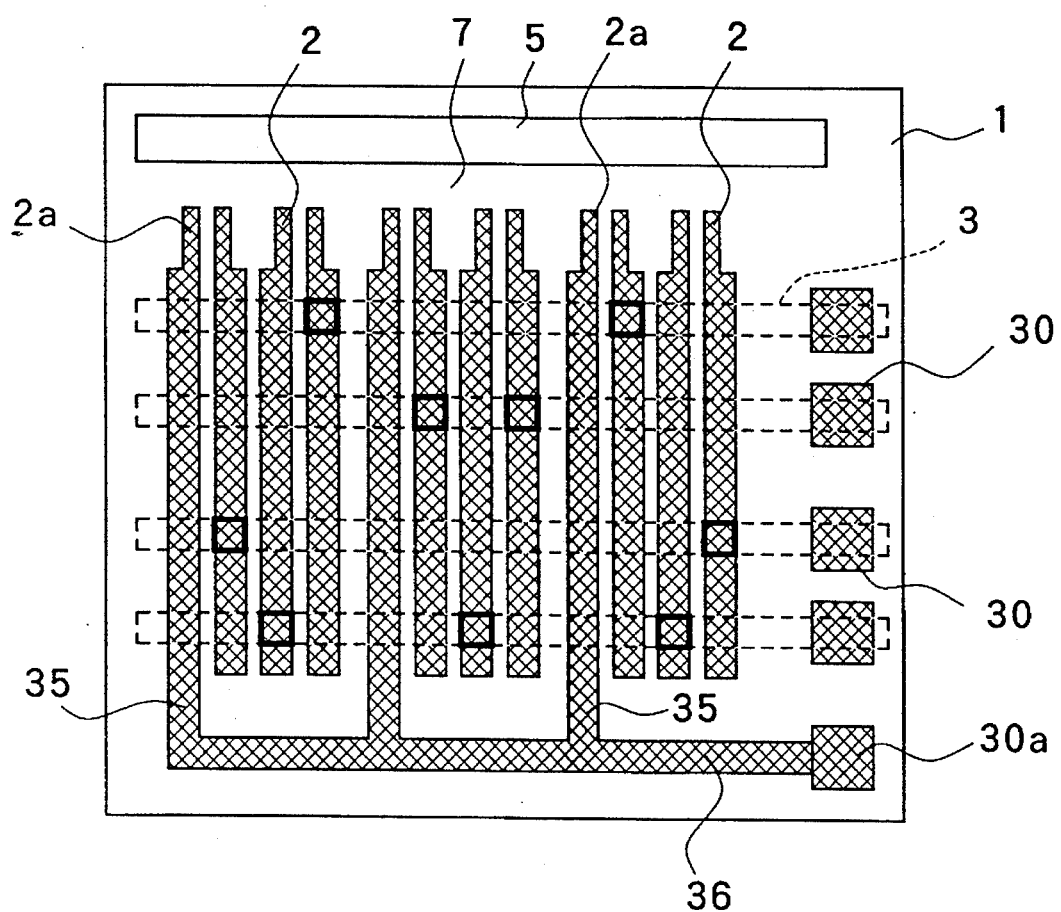
FIG. 4 is a plan view typically showing an optical circuit board of a second embodiment of the present invention.

FIG. 4 is a plan typically showing the relation between the metal electrode and aggregated electrode in the optical circuit board of the second embodiment of the present invention. This circuit board is almost similar to that of the first embodiment, but some of the metal electrodes on the first primary surface represented by numeral 2a are not connected with the aggregated electrode 3, but instead, the metal electrodes 2a are electrically connected with a common electrode 36 through a circuit pattern 35. The common electrode 36 serves as a substitute of one aggregated electrode. The common electrode 36 is provided on the first primary surface on the opposite side of the window portion 7 with each metal electrode 2, 2a disposed therebetween, having a ribbon-like form extending in the longitudinal direction of the window portion 7. On the end portion of the common electrode 36, an external connection terminal 30a is provided as a pad area to be used for connection with an external circuit. This external connection terminal 30a has a structure similar to that of the external connection terminal 30 which is connected to the aggregated electrode 3. In the present embodiment, since the circuit pattern 35 and the common electrode 36 can be formed concurrently with the metal electrode 2, 2a, there will be no practical increase in working hours for providing them. Further, when compared with the case in which all metal electrodes are connected with aggregated electrodes, this embodiment can reduce the number of the electrical connection portion 20 which penetrates the transparent substrate 1.

Figure 5A:
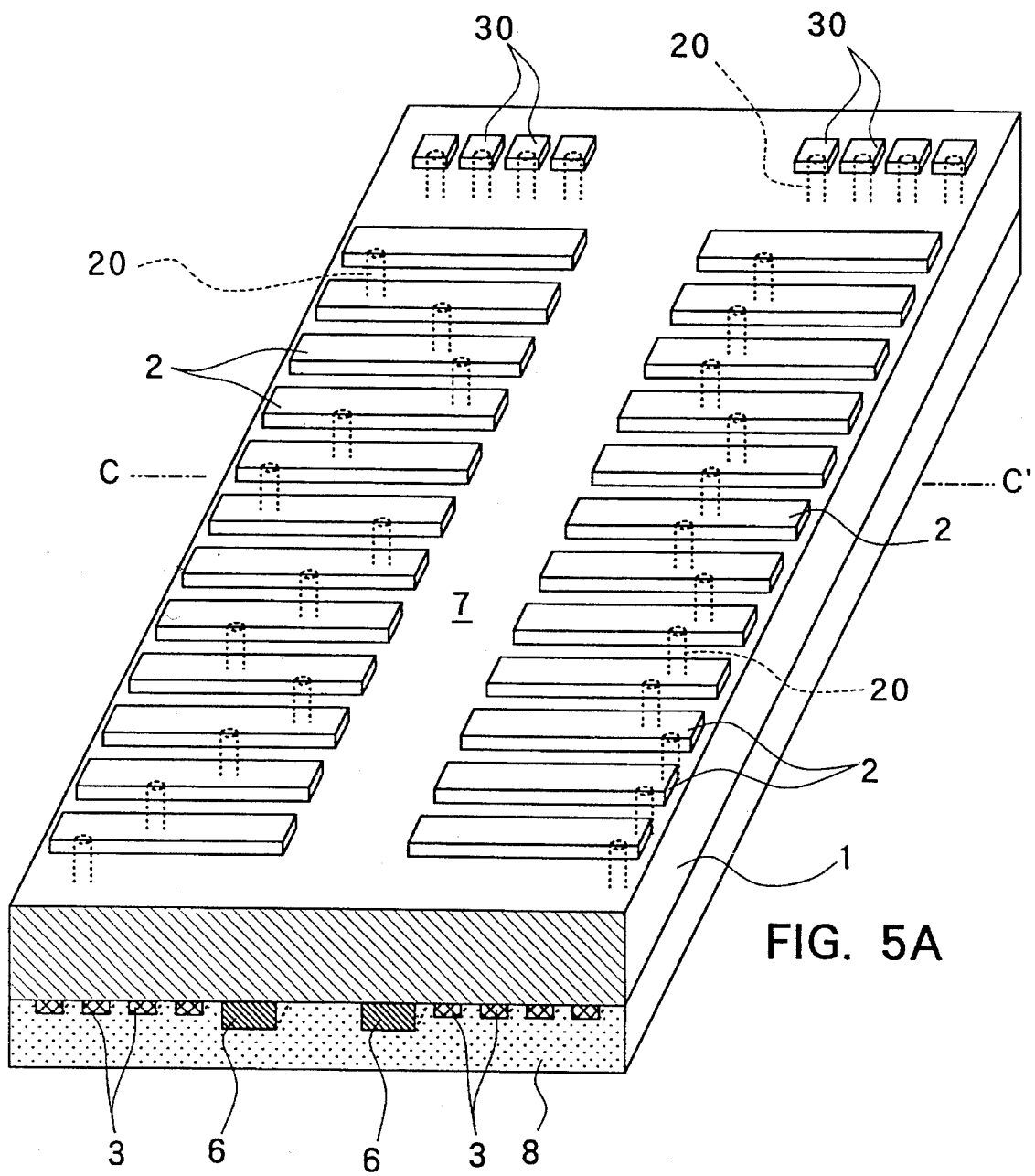
FIG. 5A is a plan view typically showing an optical circuit board of a third embodiment of the present invention.
Figure 5B:
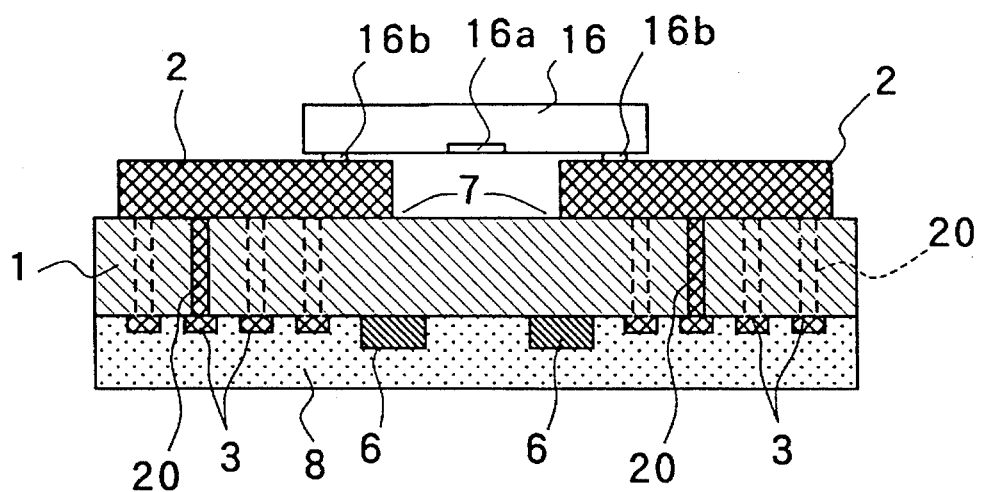
FIG. 5B is a typical cross sectional view taken along the line C—C' of FIG. 5A.

An optical circuit board of a third embodiment of the present invention is shown in FIGS. 5A and 5B. In FIG. 5B, a state of the optical circuit board is shown with a light emitting LSI chip 16 mounted thereon. In this embodiment, the metal electrodes 2 are provided on the both sides of the window portion 7 and accordingly, in the first primary surface, the window portion 7 is defined by the metal electrodes 2 disposed on both sides thereof. Therefore, the shading layer is not provided in this case. Corresponding to the area on each side of the window portion where metal electrodes 2 are formed, aggregated electrodes 3 are of course provided on the second primary surface, respectively. In other words, this circuit board has an almost symmetrical structure with reference to the surface which includes the longitudinal center line of the window portion 7 being perpendicular to the surface of the transparent substrate 1.

This optical circuit board can mount the light emitting LSI chip 16 astride pairs of metal electrodes 2 which are disposed oppositely interposing the window portion 7. In this case, a light emitting surface 16a of the light emitting LSI chip 16 is positioned just above the window portion 7 facing the window portion 7, and the light emitting LSI chip 16 having its connection bump 16b is connected thereby with respective two metal electrodes disposed oppositely interposing the window portion 7. When the optical circuit board of the present invention is applied to the optical image forming apparatus, since the light passing through the window of the circuit board is only the light emitted from the light emitting LSI chip mounted on the circuit board, the light emitting LSI chip may be disposed such that it covers the window portion as in the present embodiment. If the light emitting LSI chips are disposed in this way, since they are supported at the both ends thereof, the mechanical strength of the assembly of the circuit board and light emitting LSI chips is increased. Even when the circuit board is applied to the optical reader, by using an array type LSI chips in which the light emitting LSI chip and the light receiving LSI chips are accommodated in the same package, it becomes possible to use a circuit board in which the LSI chip is mounted covering the window portion.

The present invention will be described below with reference to practical examples.

EXAMPLE 1

Figure 6:
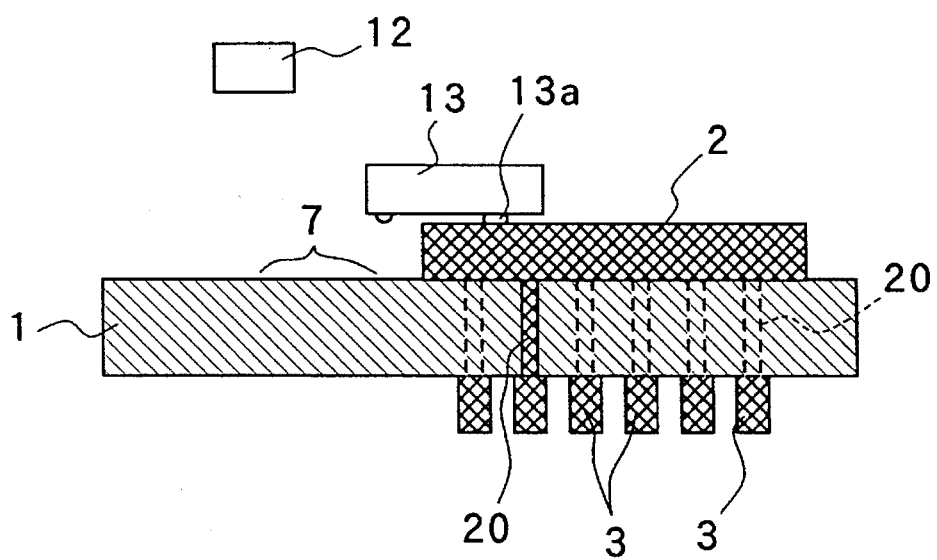
FIG. 6 is a typical cross sectional view showing the structure of an optical circuit board of example 1.

An optical circuit board was manufactured as shown in FIG. 6. This circuit board is similar to that shown in the first embodiment, but differs from which in that a shading layer, antistatic layer and protection layer are not provided. The metal electrode 2 has a light receiving LSI chip 13 bonded thereto.

A PES film of 50 μm thick was used as a transparent substrate 1, and on a first and second primary surfaces thereof, Cr (0.01 μm thick) and Cu (0.3 μm thick) were layered sequentially by means of a DC magnetron spattering method to form a metal thin film. Then, a penetration hole, which served as an electrical connection portion, was formed in the transparent substrate 1 by means of a drill at the position where the metal electrode 2 and aggregated electrode 3 were to be electrically connected. The resist ink was applied onto the metal thin film which covered the area where the metal electrode 2 and the aggregated electrode 3 were not formed so that, on the basis of the position of this penetration hole, the metal electrode 2 was formed on the first primary surface and the aggregated electrode 3 was formed on the second primary surface. The copper layer of about 0.3 μm thick was deposited on the inner wall of the penetration hole by electroless plating and further the copper layer of about 5 μm thick was provided on the inner wall of the penetration hole and an exposed metal thin film area by electroplating. This copper layer became a first metal layer of the metal electrode.

Then, by plating in an alkanol sulfonate bath, a solder layer was formed on the first metal layer as a second metal layer composed of Sn-Pb alloy of about 5 μm thick. Thereafter, the resist ink was removed followed by the removal of the unnecessary metal. Through the above process, the metal electrode 2 and the aggregated electrode 3 were provided on the transparent substrate 1 being electrically connected with each other by way of the electrical connection portion 20.

Thermosetting resin comprising silicon acrylate was applied onto the first primary surface on and around the window portion 7 and around of the metal electrode 2. A plurality of light receiving LSI chips 13 having connection bumps 13a were placed on the predetermined metal electrodes 2 respectively, then held at a temperature of 150° C. for 5 minutes under the pressure of 1 kgf/cm$^2$ for bonding the light receiving LSI chips 13 and the metal electrodes 2 concurrently setting the resin thereby. As a result, no cracks and separation were detected in the bonding part. The light from the light source 12 was transmitted through the window portion 7, and irradiated to a manuscript which was moved facing the second primary surface. Then the reflected light from the manuscript was detected by the light receiving LSI chips 13 and read by an optical reader. The result of which proved that the reading was correctly conducted.

EXAMPLE 2

Figure 7:
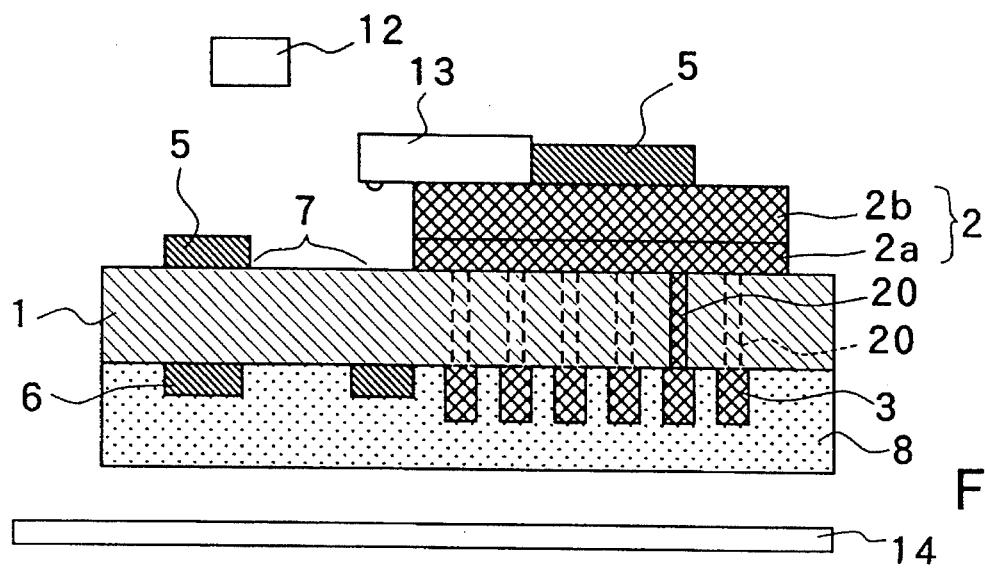
FIG. 7 is a typical cross sectional view showing the structure of an optical circuit board of examples 2, 4 and 5.

An optical circuit board was manufactured as shown in FIG. 7. This circuit board is similar to that shown in the first embodiment, but the metal electrode 2 has a structure in which a first metal layer 2a and a second metal layer 2b are layered on the transparent substrate 1 sequentially. Further, on the second metal layer 2b, there is provided a shading layer 5 with the exception of the area on which the light receiving LSI chips 13 are mounted. The shading layer 5 is also provided on the space between neighboring metal electrodes 2 as in unity with the shading layer 5 on the metal electrode 2.

A PEEK film of 50 μm thick was used as a transparent substrate 1, and on a first and second primary surfaces thereof, Cr (0.01 μm thick) and Cu (0.3 μm thick) were layered sequentially by means of a DC magnetron spattering method to form a metal thin film. Then, the resist ink was applied onto the metal thin film which covers the area where the metal electrode 2 and the aggregated electrode 3 were not formed so that the metal electrode 2 and the aggregated electrode 3 were formed on the first and second primary surfaces, respectively. A penetration hole which served as an electrical connection portion 20 was formed in the transparent substrate 1 by means of a drill at the position where the metal electrode 2 and an aggregated electrode 3 were to be electrically connected. The copper layer of about 0.3 μm thick was deposited on the inside wall of the penetration hole by electroless plating and further the copper layer of about 5 μm thick was provided on the inside wall of the hole and an exposed metal thin film area by electroplating. This copper layer constituted a first metal layer of the aggregated electrode 3 and also a first metal layer 2a of the metal electrode 2.

Then, by plating in an alkanol sulfonate bath, a solder layer was formed on the copper layer being composed of Sn-Pb alloy of about 5 μm thick. The second metal layer 2b of the metal electrode 2 was composed of this solder layer. Thereafter, the resist ink was removed followed by the removal of the unnecessary metal. Through the above process, the metal electrode 2 and the aggregated electrode 3 were provided on the transparent substrate 1 being electrically connected with each other by way of the electrical connection portion 20.

Subsequently, the shading layer 5 were formed on the first primary surface by printing, heating and setting a thermosetting resin which included a black pigment in a manner as the window portion 7 was located therebetween. At this time, the shading layer 5 was formed on the metal electrode 2 and on the space between each metal electrode 2. Further, an antistatic layer 6 having a shading property was provided on the second primary surface so as to enclose the window portion, by applying and setting a mixture of the thermosetting resin containing carbon black particles. The surface resistance of this antistatic layer 6 was 300 Ω/□, and the light transmittance of the shading layer 5 was 1% or less. Then UV setting urethane acryl resin was applied and set on the second primary surface covering the aggregated electrode 3, the antistatic layer 6 and the window portion 7 to form a protection layer 8 of 10 μm thick.

A plurality of light receiving LSI chips 13 having connection bumps were placed on the predetermined metal electrode 2 respectively, then held at a temperature of 150°

C. for 5 minutes under the pressure of 5 kgf/cm² for bonding the light receiving LSI chips 13 and the metal electrodes 2. As a result, no cracks and separation were detected in the bonding portion. The light from the light source 12 was transmitted through the window portion 7, and irradiated to a manuscript 14 which was moved facing the second primary surface. Then, the reflected light from the manuscript 14 was detected by the light receiving LSI chips 13 and read by an optical reader. As a result, it was confirmed that the reading was regularly conducted.

EXAMPLE 3

Figure 8:
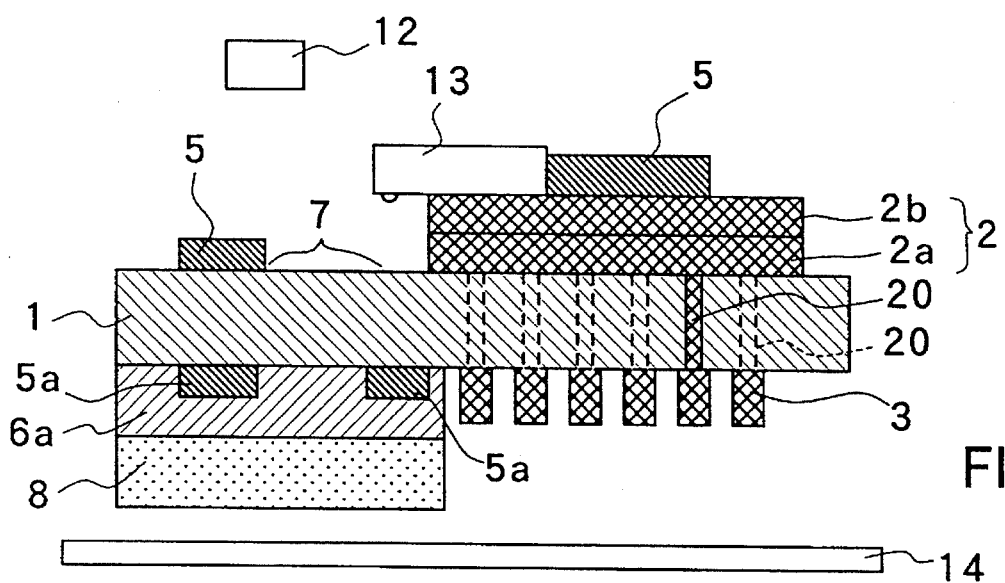
FIG. 8 is a typical cross sectional view showing the structure of an optical circuit board of example 3.

An optical circuit board was manufactured as shown in FIG. 8. This circuit board is similar to that shown in FIG. 7 of Example 2, but has a structure in which a shading layer 5a is provided in the second primary surface in such a manner to enclose a window portion 7 and a transparent antistatic layer 6a is further provided so as to cover the shading layer 5a and the window portion 7. A protection layer 8 is provided only above the antistatic layer 6a without including the area where an aggregated electrode 3 is provided.

A PES film of 25 μm thick was used as a transparent substrate 1, and on a first and second primary surfaces thereof, a Cu film of 0.3 μm thick was formed by means of a DC magnetron spattering method. Then, in the same way as the above Examples, the resist ink was applied onto a metal thin film which covered the area where a metal electrode 2 and the aggregated electrode 3 were not formed. A penetration hole which served as an electrical connection portion 20 was formed in the transparent substrate 1 by means of a perforator at the position where the metal electrode 2 and an aggregated electrode 3 were to be electrically connected. The copper layer of about 0.3 μm thick was deposited on the inside wall of the penetration hole by electroless plating for electrically connecting the thin copper films on the first and second primary surfaces each other. Further the copper layer of about 5 μm thick was provided by electroplating on the inside wall of the hole and an area with an exposed thin copper film. This copper layer constituted a first metal layer of the aggregated electrode 3 and also a first metal layer 2a of the metal electrode 2.

Next, after the resist was removed and successively the unnecessary thin copper film was removed, a solder layer composed of an Sn-Pb alloy of about 2 μm thick was formed on the copper layer by a substitution plating method. A second metal layer 2b of the metal electrode 2 was composed of this solder. Thus the metal electrode 2 and the aggregated electrode 3 were provided on the transparent substrate 1.

Subsequently, the shading layer 5, 5a were formed on both the first and second primary surfaces, by printing, heating and setting the thermosetting resin which included a black pigment in a manner as the window portion 7 was located therebetween. The shading layer 5 was formed on the metal electrode 2 and on the space between each metal electrode 2. The light transmittance of these shading layers was 1% or less. Further, a transparent and conductive antistatic layer 6 was provided on the second primary surface side so as to cover both the window portion 7 and the shading layer 5a, by applying and setting the resin including particles of the tin oxide. The surface resistance of this antistatic layer 6 was 500 Ω/□. Then, the UV setting urethane acryl resin was applied and set in a manner which covers the antistatic layer 6 to form a protection layer 8 of 10 μm thick.

Then, by holding the above circuit board at a temperature of 150° C. for 30 seconds under the pressure of 5 kgf/cm², the light receiving LSI chip 13 and the metal electrode 2 were bonded with each other. As a result, no cracks and separation were detected in the bonding portion, and it was confirmed that the reading as an optical reading sensor was regularly conducted.

EXAMPLE 4

An circuit board was manufactured which had the same structure as that shown in FIG. 7 of the Example 2. On a first and second primary surfaces of the transparent substrate 1 made of a Capton V film of 25 μm thick, a thin copper film of 1 μm thick was formed by an ion evaporation thin film forming method and a penetration hole which was to serve as an electrical connection portion was formed in the transparent substrate 1. Then, the resist ink was applied on the thin copper film which covered the area where a metal electrode 2 and an aggregated electrode 3 were not formed. The copper layer of about 0.3 μm thick was deposited on the inside wall of the penetration hole by the electroless plating and the copper layer of about 10 μm thick was provided by electroplating on the inside wall of the hole and an area with an exposed thin copper film. This copper layer constituted the aggregated electrode 3 and also a first metal layer 2a of the metal electrode 2. After a Ni layer of 1 μm thick was formed on the copper layer (first metal layer 2a) on the first primary surface side, a gold layer of 1 μm thick was provided by the gold plating for forming a second metal layer 2b of the metal electrode 2. Thus the metal electrode 2 and the aggregated electrode 3 which were connected through an electrical connection portion 20 were provided on the transparent substrate 1.

Subsequently, the shading layer 5 were formed on the first primary surface by printing and setting the UV setting colored resin Raycure 4200 (Jujo Kako Inc.) so as to define the window portion 7. Further, on the second primary surface side, the thermosetting resin (Mitsui Toatsu Chemicals Inc.; Structbond 920) including carbon black particles was coated so as to define the window portion 7 and thermally set, and thus an antistatic layer 6 having a light shading property was formed. The surface resistance of this antistatic layer 6 was 300 Ω/□, and its light transmittance was 1% or less. Then, UV setting urethane acryl resin was applied and set on the second primary surface in such a way that it covered the aggregated electrode 3, the antistatic layer 6 and the window portion 7 to form a protection layer 8 of 10 μm thick.

By press bonding light receiving LSI chips 13 having Al bumps to the metal electrode 2 at a temperature of 200° C. for 30 seconds, the light receiving LSI chips 13 were mounted on the circuit board. As a result, there were no cracks and separation at the bonding portion. By attaching the circuit board mounted with the light receiving LSI chips to the optical reader, it was tested. The result was satisfactory to confirm that the optical reader can read the data correctly.

EXAMPLE 5

A circuit board was manufactured having the structure the same as that shown in FIG. 7 of the embodiment 2, but in which no shading layer was provided on a second metal layer of a metal electrode 2. A copper foil of 18 μm thickness was first treated by a dying-black treatment applied to the both surfaces thereof, and then a PES film of 10 μm thickness was formed on one side thereof by a casting method. This PES film constituted a transparent substrate 1 and the copper foil surface constitutes a second primary surface of the transparent substrate 1. Next, a thin copper layer of 0.3 μm thickness was formed on a first primary surface of the transparent substrate 1, that was, on the surface on which the copper foil was not provided, by means of a DC magnetron spattering method.

Then, on both the first and the second primary surfaces, the resist ink was applied onto the copper foil and the thin copper film which covered the area other than the area where the metal electrode 2, an aggregated electrode 3 and a shading layer 5 were formed. Further on the thin copper film on the first primary surface, a solder layer composed of Sn-Pb alloy of about 5 μm thick was provided by electroplating in the alkanol sulfonate bath. This solder layer constituted a second metal layer 2b of the metal electrode 2 and also a second layer of the shading layer 5. By etching the copper foil on the second primary surface side, the aggregated electrode 3 and an antistatic layer 6 were formed. In this Example 5, the antistatic layer 6 was structured by the copper foil. The resist ink was then removed.

Next, a heating electrode and a welding electrode head were contacted to the position where the metal electrode 2 and the aggregated electrode 3 were electrically connected, thereby forming an electrical connection portion 20 which connected between the primary surfaces. Further, a UV setting urethane acryl resin was applied and set on the second primary surface side in a manner that it covered the aggregated electrode 3, the antistatic layer 6 and a window portion 7 thus forming a protection layer 8 of 15 μm thick.

The light receiving LSI chips 13 with bumps and the metal electrodes 2 were joined by press bonding under the condition of 5 kgf/cm$^2$, 200° C. and 30 seconds. No cracks and separation were detected in the joint portion. It was further confirmed that the optical reader having the circuit board mounted with the above device worked normally for reading.

EXAMPLE 6

Figure 1:
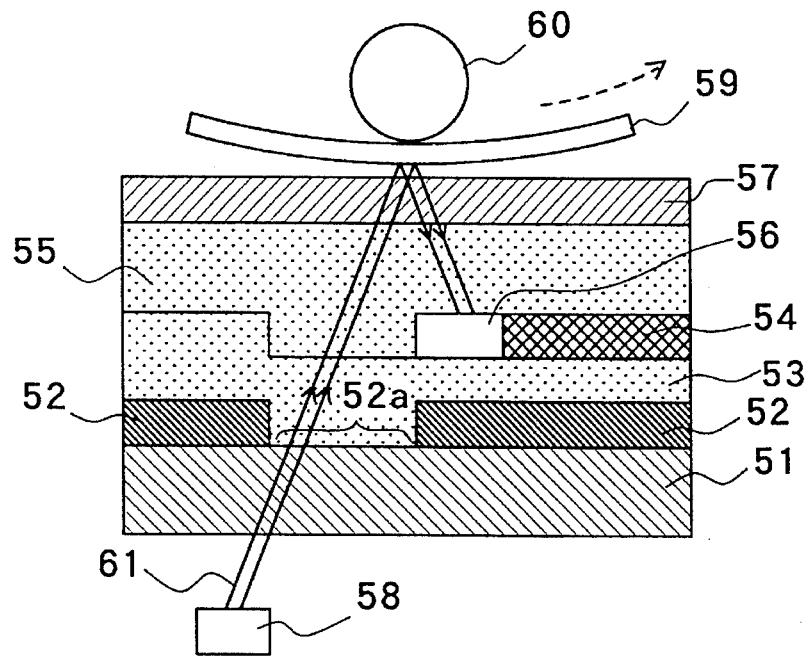
FIG. 1 is a typical sectional view showing an example of the structure of a conventional image sensor.
Figure 9:
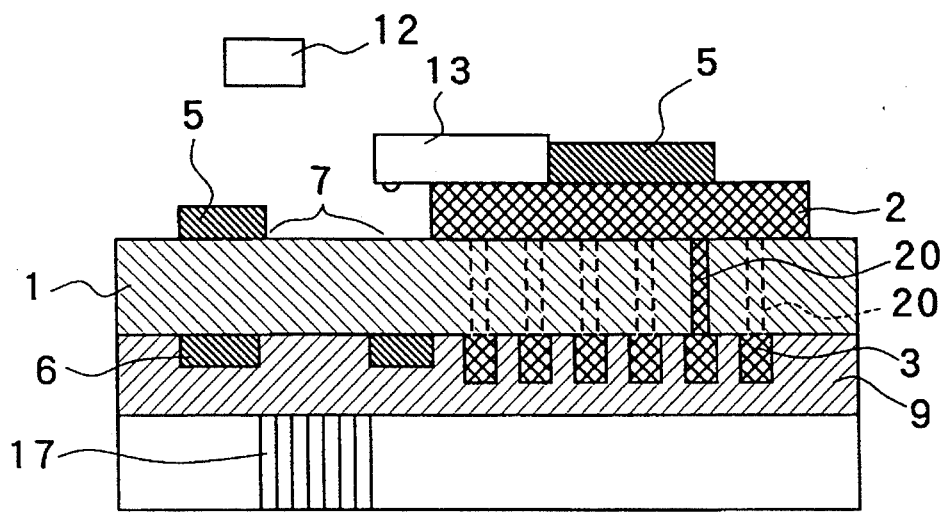
FIG. 9 is a typical cross sectional view showing the structure of an optical circuit board of example 6.

A circuit board shown in FIG. 9 was manufactured. This circuit board had a structure comprising a lens provided by bonding a Selfoc™ lens (a rod lens array) 17 to the second primary surface side of the transparent substrate 1, through an adhesive layer 9, of the circuit board illustrated in FIG. 6 of Example 1. In addition to that, a shading layer 5 formed of the thermosetting resin which included a black pigment was provided on the first primary surface of the transparent substrate 1 so as to define the window portion 7 including the shading layer 5 provided on the second metal layer 2b. For the adhesive layer 9, the UV setting acrylate resin was employed. The lens 17 was positioned corresponding to the window portion 7. After mounting a plurality of light receiving LSI chips in the same way as FIG. 1, a reading test was executed and confirmed that the result was satisfactory.

EXAMPLE 7

Figure 10:
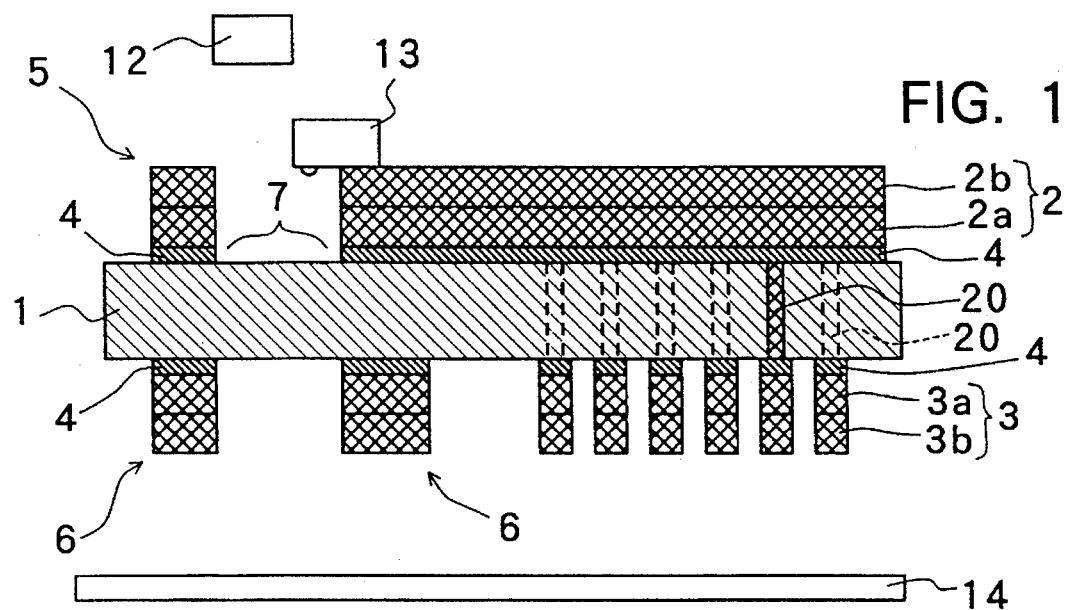
FIG. 10 is a typical cross sectional view showing the structure of an optical circuit board of examples 7, 8, 10, and 11.

An optical circuit board was manufactured as shown in FIG. 10. This circuit board is similar to that shown in the first embodiment, but no protection layer was provided. A metal electrode 2, an aggregated electrode 3, a shading layer 5 and an antistatic layer 6, each had a laminated structure of two metal layers, and a low reflection layer 4 of low light reflectance was placed between the lower metal layer and the transparent substrate 1.

A PES film of 50 μm thick was used as a transparent substrate 1, and on a first and second primary surfaces thereof, a black nickel oxide layer of 0.1 μm thick was formed as a low reflection layer 4 by means of a DC magnetron spattering method followed by a thin copper film of 0.5 μm thick formed on the above low reflection layer 4 by the same method.

Then, a mask for protection use was layered all over the second primary surface. A resist resin was printed on the first primary surface with a pattern corresponding to the metal electrode 2 and the shading layer 5, and then a copper layer of 5 μm was formed by electroplating. The thin copper film and this copper layer composed a first metal layer 2a. Then, by electroplating in an alkanol sulfonate bath, a second metal layer 2b comprising a Sn-Pb alloy of about 5 μm thick was formed on the first metal layer. Thereafter, the resist ink was removed, and following which the unnecessary nickel oxide and thin copper film were removed by flash-etching. Through the above process, the metal electrode 2 and the shading layer 5 were provided in such a manner to define the window portion 7. Further, it was arranged to form external connection terminals together with the formation of the metal electrode 2.

Subsequently, a mask for protection use was layered on the first primary surface, the mask on the second primary surface was removed, and the resist resin was printed on the second primary surface on the area where the aggregated electrode 3 and the antistatic layer 6 were not formed. Succeedingly, the solder layer was formed by electroplating, the resist was removed, and then the unnecessary nickel oxide and thin copper film were removed to form the aggregated electrode 3 and the antistatic layer 6 which had the shading property being provided for defining the window portion 7. The aggregated electrode 3 had a first metal layer 3a on the transparent substrate 1 side thereof comprising a thin copper film, and a solder layer was stacked on the first metal layer 3a as a second metal layer 3b. The reflectance of the low reflection layer 4 composed of the nickel oxide was 29%.

An electrical connection portion 20 was formed by resistance welding and thus the metal electrode 2 and the external connection terminal were electrically connected with the aggregated electrode 3 thereby completing the optical circuit board.

Light receiving LSI chips 13 for reading which had connection bumps were joined to the circuit board under the condition of 170° C. maintained for 3 minutes, and in the same way, the external connection terminal and an external driving circuit board were joined. In this case, no cracks and separation were detected in the joint portions. The light from a light source 12 was transmitted through the window portion 7 and irradiated to a manuscript 14 which moved facing the second primary surface. Detecting the light reflected from the manuscript with the light receiving LSI chips 13, the light was read by an optical reader. As a result, it was confirmed that the reading activity was duly effected.

EXAMPLE 8

A circuit board shown in FIG. 10 was manufactured in the same way as Example 7. However, with reference to the forming process of a metal electrode 2 and a shading layer 5 formed on a first primary surface side, a process for manufacturing a copper layer by electroplating was omitted. Specifically, a first metal layer 2a of the metal electrode 2 was composed of only a thin copper film formed by a DC magnetron sputtering method.

Light receiving LSI chips 13 for reading having connection bumps were joined to the thus produced circuit board under the condition of 170° C. maintained for 3 minutes, and in the same way, the external connection terminal and an external driving circuit board were joined. In this case, no cracks and separation were detected in the joint portions. The light from a light source 12 was transmitted through a window portion 7 and irradiated to a manuscript 14 which moved facing the second primary surface. Detecting the light reflected from the manuscript with the light receiving LSI chips 13, the light was read by an optical reader. As a result, the correct reading by the optical reader was confirmed.

EXAMPLE 9

Figure 11:
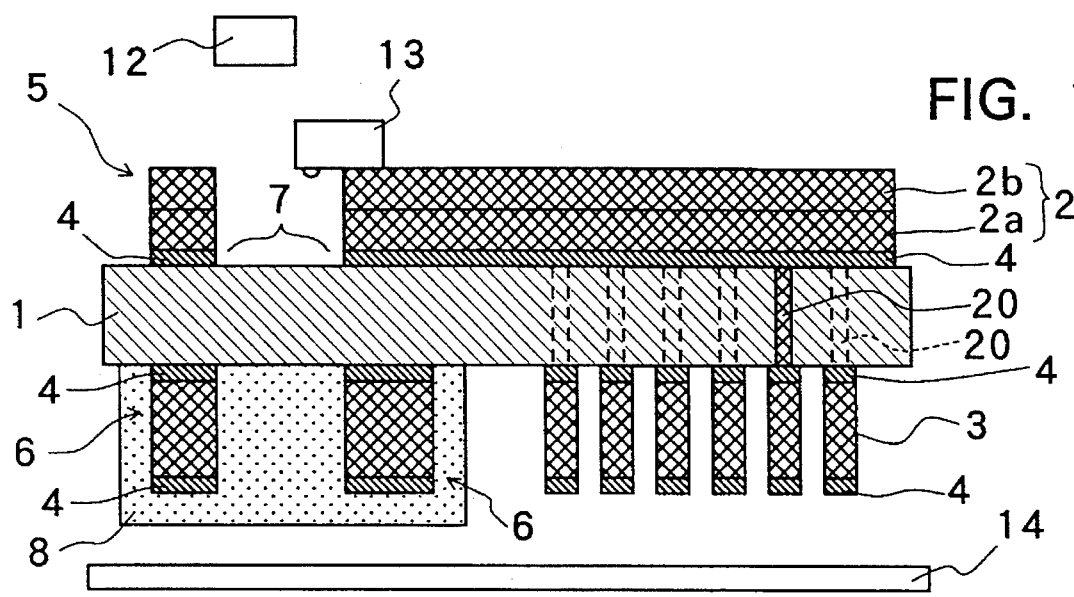
FIG. 11 is a typical cross sectional view showing the structure of an optical circuit board of example 9.

An optical circuit board was manufactured as shown in FIG. 11. This circuit board is similar to that shown in FIG. 10, but it differs from the circuit board shown in FIG. 10 in that an aggregated electrode 3 and an antistatic layer 6 are composed of only a copper foil whose both surfaces are dying-black treated, and further a transparent protection layer 8 was provided on a second primary surface so as to cover a window portion 7 and the antistatic layer 6.

A copper foil of 18 μm thick was first treated by a dying-black treatment applied to both surfaces thereof, and then a PES film of 10 μm thick was formed on one side thereof by a casting method. This PES film constituted a transparent substrate 1 and the copper-foil-provided surface constituted the second primary surface of the transparent substrate 1. Next, a black nickel oxide layer (low reflection layer 4) of 0.1 μm thick and a thin copper layer of 0.3 μm thick were sequentially formed on a first primary surface of the transparent substrate 1 by means of a DC magnetron sputtering method. This thin copper film was a first metal layer 2a of the metal electrode 2.

Then, a mask for protection use was layered all over the copper leaf on the second primary surface. A resist resin was printed on the first primary surface with a pattern corresponding to the metal electrode 2 and a shading layer 5. Then, by electroplating in an alkanol sulfonate bath, a solder layer comprising a Sn-Pb alloy of about 5 μm thick was formed on the thin copper layer. This solder layer was a second metal layer 2b of the metal electrode 2. Thereafter, the resist ink was removed, and following which the unnecessary nickel oxide and thin copper film were removed. Through the above process, the metal electrode 2 and the shading layer 5 were provided.

Subsequently, a mask for protection use was layered on the first primary surface, and the mask on the second primary surface was removed, then the resist resin was printed on the second primary surface on the area where the aggregated electrode 3 and the antistatic layer 6 were not formed. Succeedingly, the copper foil was processed by etching and the resist was removed to form the aggregated electrode 3 and the antistatic layer 6 having a shading property. Since the aggregated electrode 3 and the antistatic layer 6 were each composed of a copper foil which was dying-black treated on both sides thereof, the low reflection layer 4 was provided at the connection between the aggregated electrode 3 or the antistatic layer 6 and the transparent substrate 1, and on the surface of the substrate which was on the side of a manuscript 14.

Next, a heating electrode and a welding electrode head were contacted to the position where the metal electrode 2 and the aggregated electrode 3 were connected to perform the resistance welding, thereby forming an electrical connection portion 20 which connected between these electrodes. Further, a UV setting urethane acryl resin was applied and set on the second primary surface side in a manner that it covered the window portion 7 and the antistatic layer 6, thus forming a protection layer 8 of 25 μm thick.

Semiconductor light receiving LSI chips 13 with bumps and the metal electrodes 2 were joined being pressed and heated under the condition of 5 kgf/cm², 150° C. maintained for 5 minutes. No cracks and separation were detected in the joint portion. By performing the read test, it was confirmed that the reading was conducted normally.

EXAMPLE 10

An optical circuit board was manufactured with the same structure as that shown in FIG. 10 of Example 7. On a first and second primary surfaces of a transparent substrate 1 which was of a uniaxially drawn PEEK film of 25 μm thick, a low reflection layer 4 was formed with a black nickel oxide of 0.1 μm thick by a DC magnetron spattering method, and succeedingly a thin copper film of 0.5 μm was formed.

On the first and second primary surfaces, a predetermined pattern of a resist resin was applied and then a copper layer of 5 μm thick was formed by electroplating. Subsequently, the resist resin was removed, unnecessary thin copper films were removed by flash etching, and a solder layer of about 1 μm thick was formed by a substitution solder plating method. Through the above process, a metal electrode 2, an aggregated electrode 3, a shading layer 5 and an antistatic layer 6 were formed. The metal electrode 2 and the aggregated electrode 3 were composed of first metal layers 2a, 3a made of copper, and second metal layers 2a, 2b made of solder, respectively. An external connection terminal was formed concurrently.

Electrical connection portions 20 were formed by resistance welding for electrically connecting between the metal electrode 2, the external connection terminal and the aggregated electrode 3, respectively, to complete the optical circuit board. In this Example 10, it was possible to arrange 80 number of the metal electrodes 2 into 8 number of the aggregated electrodes 3. In the same way as the Example 1, a light receiving device 13 was mounted by bonding. There were no cracks and separation detected. According to the result of the reading test, it was confirmed that the reading activity was correctly executed.

EXAMPLE 11

An optical circuit board was manufactured with the same conditions as Example 10 with the exception of the condition for bonding light receiving LSI chips 13 and the circuit board, the bonding condition applied was 5 kgf/cm², 150° C. press bonding for 5 minutes per one bump of the light receiving LSI chips. No cracks and separation were detected in the bonding portion thus manufactured. The read test later performed proved that the reading function was normal.

EXAMPLE 12

Figure 12:
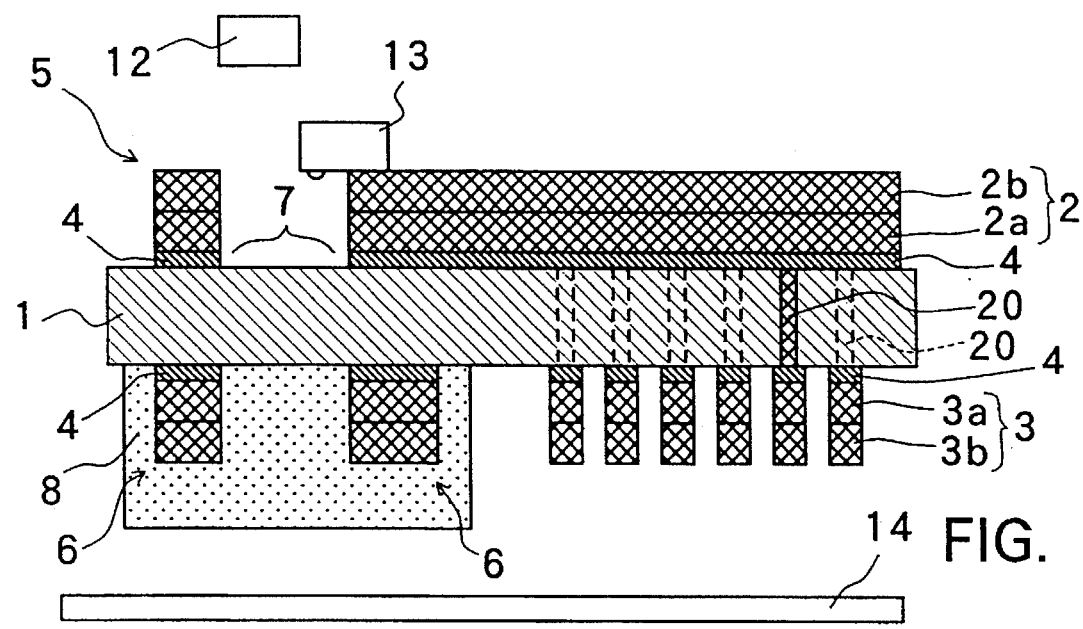
FIG. 12 is a typical cross sectional view showing the structure of an optical circuit board of examples 12 and 13.

An optical circuit board shown in FIG. 12 was manufactured. This circuit board had a structure the same as that shown in FIG. 10 of Example 10, but in addition had a protection layer 8 provided so as to cover a window portion 7 and an antistatic layer 6. The protection layer 8 was formed by applying and setting the UV setting urethane acryl resin of 10 µm thick after the aggregated electrode 3 and the antistatic layer 6 were formed.

Under the pressure of 10 kgf/cm$^2$ per bump applied thereto, a bump of a light receiving device 13 was pressed to a metal electrode 2. By subsequently receiving thermal air circulation heating (140° C., 20 minutes), the light receiving device 13 was bonded to the circuit board. There were no cracks and separation detected. According to the result of the reading test, it was confirmed that the reading was correctly performed.

EXAMPLES 13

An optical circuit board was manufactured with the same structure as that shown in FIG. 12 of the Example 12. On a first and second primary surfaces of a Capton V film of 25 µm thick, a black chromium oxide of 0.1 µm thick and a thin copper layer of about 1 µm thick were sequentially formed by a DC magnetron sputtering method. The black chromium oxide layer composed a low reflection layer 4.

On the thin copper layer formed on the first and the second primary surfaces, a predetermined pattern of a resist resin was applied. Then, a perforation hole was made in the transparent substrate 1 by means of a perforator, a copper layer was formed inside the penetration hole by electroless plating for forming an electrical connection portion 20. Through the above process, electrical connection between a metal electrode 2 on the first primary surface and an aggregated electrode 3 on the second primary surface completed. Further by electroplating, a copper layer of about 5 µm was formed on the above copper layer. Subsequently, after the resist resin was removed and unnecessary thin copper films were removed by etching, a solder layer comprising a Sn-Pb alloy of about 2 µm thick was formed by a substitution plating method. Further, UV setting urethane acryl resin was applied and set on the second primary surface in a manner that it covered an antistatic layer 6 and a window portion 7, thus forming a protection layer 8 of 10 µm thick. In the metal electrode 2, the first metal layer 2a was composed of copper and the second metal layer 2b was composed of solder.

Thus completed circuit board and a light receiving device 13 with a bump were joined being pressed and heated under the condition of 5 kgf/cm$^2$, 150° C. maintained for 3 minutes. No cracks and separation were detected in the joint portion, and it was confirmed that the reading device worked normally for reading.

EXAMPLE 14

Figure 13:
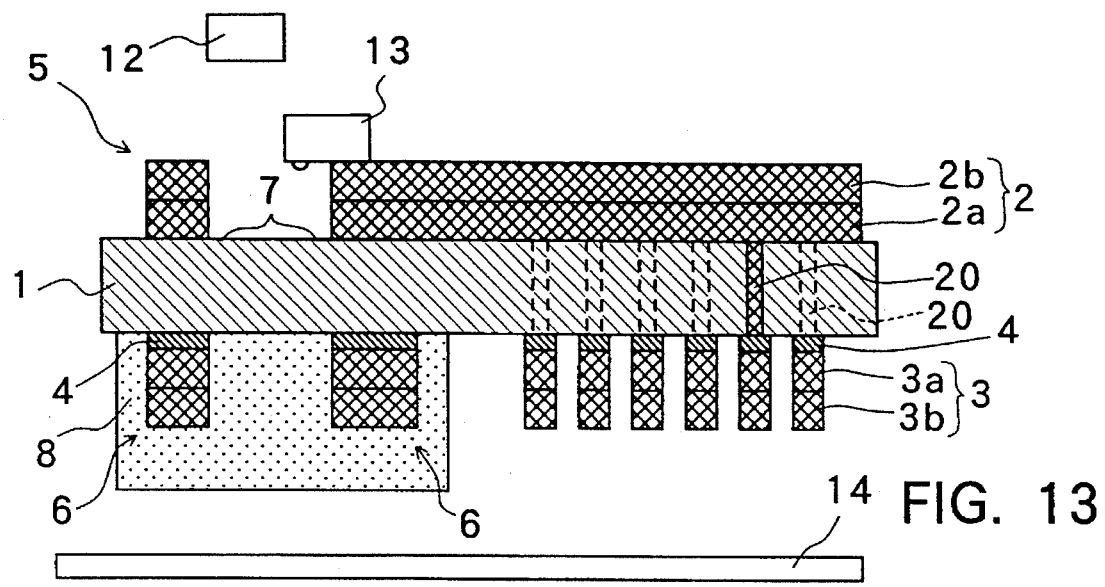
FIG. 13 is a typical cross sectional view showing the structure of an optical circuit board of example 14.

An optical circuit board shown in FIG. 13 was manufactured. This circuit board has a similar structure as that shown in FIG. 12 of Example 12, but this differs from the circuit board of FIG. 12 in that a low reflection layer is not provided in a first primary layer.

A PES film of 30 µm thick having a thin copper film of 1µ thick formed beforehand on a first primary surface by means of a sputtering method was used as a transparent substrate 1. A copper foil of 18 µm thick with one side dying-black treated was layered on a second primary surface of the transparent substrate 1 through a transparent epoxy base adhesive with dying-black side thereof facing the transparent substrate 1. The copper foil on the second primary surface was covered with a mask, and a predetermined pattern of a resist resin was applied onto the thin copper film on the first primary surface. By electroplating, a solder layer of about 3 µm thick comprising a Sn-Pb alloy was formed on the thin copper layer. Subsequently, after removing the resist resin, the unnecessary thin copper film was removed, thereby forming a metal electrode 2 and a shading layer 5. It was arranged that an external connection terminal was also formed concurrently on the first primary surface. In the metal electrode 2, a thin copper film and a solder layer correspond to a first and second metal layers 2a, 2b, respectively.

A protective mask on the second primary surface was stripped off, and a mask was provided on the first primary surface. A predetermined pattern of the resist ink was applied to the copper foil on the second primary surface, and unnecessary copper foil was removed by etching. Through these processes, a plurality of aggregated electrodes of a predetermined form and an antistatic layer 6 provided so as to define a window portion 7, were both formed. Then, the mask on the first primary surface was removed, and the metal electrode 2 and the external connection terminal were welded with the aggregated electrode 3 by resistance welding. Finally, a protection layer 8 similar to that shown in Example 5 was provided on the second primary surface so as to cover the window portion 7 and the antistatic layer 6.

The joining of this circuit board and a light receiving LSI chip 13 was performed by a thermal circulation heating method with a gas temperature of 120° C. The bonding between an external driving board and the external connection terminal was performed under the condition of 5 kgf/cm$^2$, 185° C. maintained for 3 seconds. There was no separation in the bonded place and it was confirmed that the reading device worked normally.

EXAMPLE 15

Figure 14:
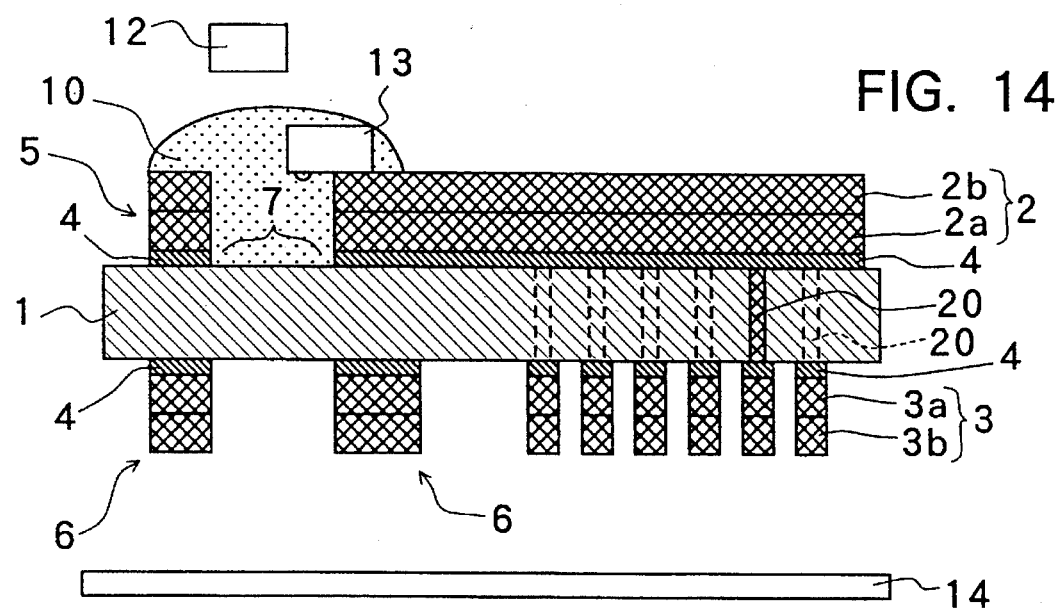
FIG. 14 is a typical cross sectional view showing the structure of an optical circuit board of examples 15 and 16.

A circuit board shown in FIG. 14 was manufactured. This circuit board has a similar structure to that shown in FIG. 10, but differs in that the whole light receiving LSI chips are covered with a transparent sealing resin.

On each of a first and second primary layers of a transparent substrate 1 which was a PES film of 50 µm thick, a black chromium oxide layer of 0.1 µm thick was formed as a low reflection layer 4 by means of a DC magnetron sputtering method, and successively a thin copper film of 0.5 µmd thick was formed. After a resist resin was printed on each of the first and second primary surfaces with the same pattern as Example 7, a copper layer of about 5 µm thick was formed on the thin copper film by electroplating, and successively, a tin layer of about 5 µm thick was formed thereon in the same way as above. Then, the resist resin was removed and the unnecessary chromium oxide and thin copper film were removed by flash-etching. Through these processes, a metal electrode 2, an aggregated electrode 3, a shading layer 5 and an antistatic layer 6 were formed. Here, the metal electrode 2 and the aggregated electrode 3 were composed of first metal layers of copper 2a, 3a and second metal layers of tin 2b, 3b, respectively. At this time, the external connection terminal was also formed. Between the metal electrode 2, the external connection terminal and the aggregated electrode 3 were electrically connected respectively in the same way as Example 5, and a protection layer 8 was provided in the same manner as the Example 9.

Light receiving LSI chips 13 with bumps made of gold were pressed to the metal electrodes 2 with the pressure of 10 kgf/cm$^2$ per pad, and held at a temperature of 185° C. for 30 seconds, thus the light receiving LSI chips 13 were bonded to the circuit board. Subsequently, the polyester base thermosetting resin was applied to cover the whole light receiving LSI chips 13, and heated at 140° C. for 20 minutes to set the resin and form the set resin layer 10. Further in the same way as above, an external driving circuit board was bonded to the external connection terminal. As a result, no cracks and separation were detected in the bonding portions. With an optical reader attached with this circuit board, checked the light from the light source 12 transmitted through the window portion 7, irradiated to a manuscript 14 which was placed on the second primary surface side, reflected from the manuscript 14 and transmitted through the window portion 7, the light was detected by the light receiving LSI chips 13 and read by the optical reader. As a result, it was confirmed that the reading function was normal.

EXAMPLE 16

A circuit board was manufactured which had a similar structure to that shown in FIG. 14 of Example 15.

On each of a first and second primary surfaces of a transparent substrate 1 which was a PES film of 50 μm thick, a black nickel oxide layer of 0.1 μm thick was formed as a low reflection layer 4 by means of a DC magnetron spattering method, and successively a thin copper film of 0.5 μmd thick was formed thereon. A resist resin was printed on the thin copper film on each of the first and second primary surfaces with the predetermined patterns. Subsequently, a perforation hole was formed with a perforator at the position where a metal electrode 2 and an aggregated electrode 3 were to be connected. By forming a copper layer on the inside of the penetration hole by electroless plating, the electrical connection between a metal electrode 2 and an aggregated electrode 3 was completed. Thereafter, a copper layer of about 5 μm thick was formed thereon by electroplating, and successively, a nickel layer of about 2 μm thick was formed thereon followed by a final gold layer of 0.2μ thick in the same way as above. Then, the resist resin was removed and the unnecessary nickel oxide and thin copper film were also removed. Through the above process, the metal electrode 2, the aggregated electrode 3, a shading layer 5 and an antistatic layer 6 were formed. Here, the metal electrode 2 and the aggregated electrode 3 were composed of first metal layers of copper 2a, 3a and second metal layers of nickel and gold 2b, 3b, respectively. The external connection terminal was also formed at the same time when the metal electrode 2 was formed. A protection layer 8 was provided in the same manner as Example 9.

Light receiving LSI chips 13 with bumps made of aluminum were pressed to the metal electrodes 2 with the pressure of 10 kgf/cm$^2$ per pad, and held at a temperature of 185° C. for 30 seconds, thus the light receiving LSI chips 13 were bonded to the circuit board. Subsequently, a polyester base thermosetting resin was applied to cover the whole light receiving LSI chips 13 and to fill the space between the circuit board and the light receiving LSI chips 13, then heated at 140° C. for 20 minutes to set the resin and form the set resin layer 10. Further, an external driving circuit board with a connection bump made of a solder layer was bonded to the external connection terminal by being pressed thereto with a pressure of 2 kgf/cm$^2$ and holding at a temperature of 180° C. for 30 seconds. As a result, no cracks and separation were detected in the connection, and it was confirmed that the reading function was normal.

EXAMPLE 17

Figure 15:
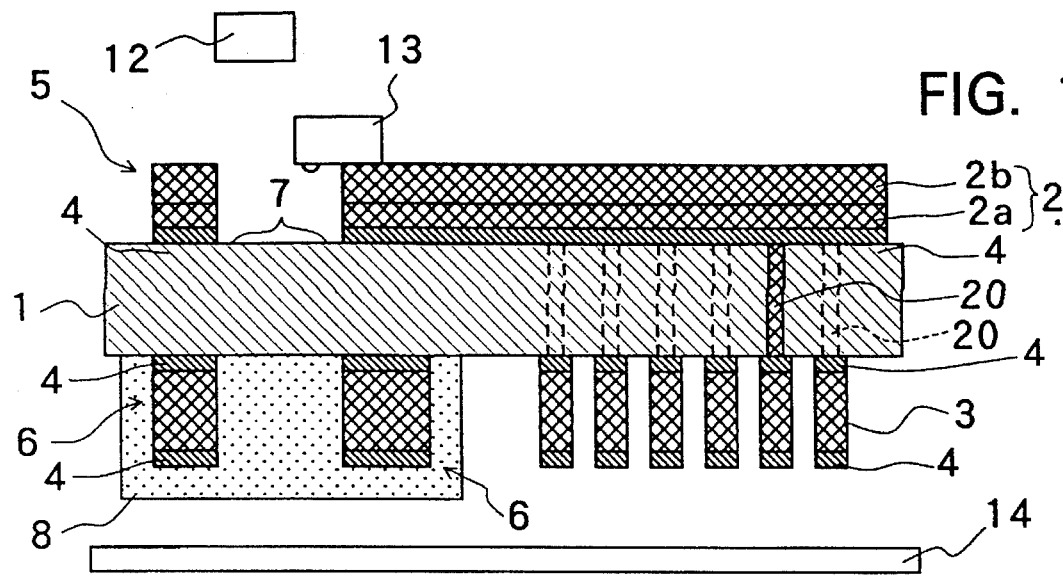
FIG. 15 is a typical cross sectional view showing the structure of an optical circuit board of example 17.

An optical circuit board was manufactured as shown in FIG. 15. This circuit board has a structure similar to that shown in FIG. 11.

A copper foil of 18 μm thick was immersed in the mixed aqueous solution of sodium hydroxide and potassium persulfate maintained at 90° C. for 20 minutes, and then a dying-black treatment was applied to the both sides of the copper foil. A melted PES of 20 μm thick was extruded on the copper foil through a T die of an extruder, thereby forming a laminate composed of the PES film and the copper foil. Thus the PES film constituted a transparent substrate 1 and the copper foil is disposed on a second primary surface of the transparent substrate 1.

On the PES film of the laminate, that was, on the first primary surface of the transparent substrate 1, a nickel layer of 3 μm thick (low reflection layer 4) and a thin copper layer of 0.5 μm thick were formed sequentially by means of a DC magnetron sputtering method. This thin copper film constituted a first metal layer 2a of a metal electrode 2.

Then, a mask for protection use was layered all over the thin copper foil on the second primary surface, and the resist resin was applied on the thin copper film on the first primary surface with a predetermined pattern. Then, by electroplating in an alkanol sulfonate bath, a solder layer comprising a Sn-Pb alloy of about 5 μm thick was formed on the thin copper layer. This solder layer was a second metal layer 2b of the metal electrode 2. Thereafter, the resist ink was removed, and following which the unnecessary nickel and thin copper film were removed by etching. Through the above process, the metal electrode 2, a shading layer 5 and an external connection terminal were provided on the first primary surface.

Subsequently, a mask for protection use was layered on the first primary surface, the mask on the second primary surface was removed. Then resist ink was applied on the copper foil on the second primary surface with a predetermined pattern. Next, the copper foil was processed by etching, and following which the resist was removed to form an aggregated electrode 3 and an antistatic layer 6 having the shading property. The aggregated electrode 3 and the antistatic layer 6 each had a low reflection layer 4 composed of a dyed-black treated layer on both sides thereof. Next, after the mask on the first primary surface was removed, resistance welding was applied in the same way as in Example 1 to electrically connect the metal electrode 2 and the external connection terminal with the aggregated electrode 3, respectively. Further on the second primary surface, a protection layer 8 was formed in such a manner to cover a window portion 7 and the antistatic layer 6, in the same way as Example 3.

A light receiving device 13 was mounted on a circuit board as in Example 9, and the read test was applied with reference to a manuscript 14. As a result of the test, no cracks and separation were detected in the joint portions, and it was confirmed that reading can be duly performed according to the above process.

EXAMPLE 18

Figure 16:
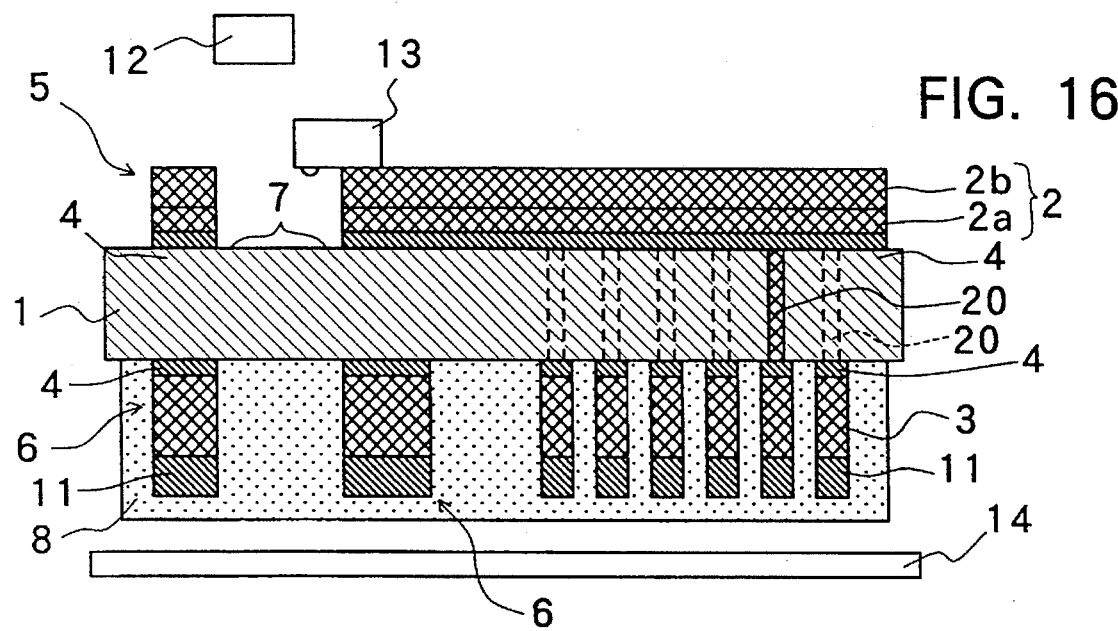
FIG. 16 is a typical cross sectional view showing the structure of an optical circuit board of example 18.

A circuit board was manufactured as shown in FIG. 16. This circuit board is similar to that shown in FIG. 15, but it differs in that a black insulation resin layer is provided on the surface of an aggregated electrode 3 and an antistatic layer 6 as a low reflection layer.

A copper foil of 12 μm thick, only one side of which was dyed-black treated, was first prepared. Then a PES film of 15 μm thick was formed on the dyed-black treated surface of the copper foil by a casting method. This PES film corresponded to a transparent substrate 1 and the copper foil was disposed on a second primary surface of the transparent substrate 1. Next, a nickel layer of 0.05 μm thick (low reflection layer 4) and a thin copper film of 0.5 μm thick were sequentially formed on a first primary surface of the transparent substrate 1 by means of a DC magnetron sputtering method.

Then, a mask for protection use was layered all over the copper foil on the second primary surface. A resist film was stuck on the thin copper film on the first primary surface, a predetermined pattern was printed and the unnecessary resist was removed. Then, by electroplating in an alkanol sulfonate bath, a solder layer comprising a Sn-Pb alloy of about 3 μm thick was formed on the thin copper layer. Thereafter, the resist was removed, and following which the unnecessary nickel and thin copper film were removed by etching. Through the above process, a metal electrode 2, a shading layer 5 and an external connection terminal were provided on the first primary surface. A window portion 7 was defined by the metal electrode 2 and the shading layer 5.

Subsequently, a mask for protection use was layered on the first primary surface, the mask on the second primary surface was removed. A black colored thermosetting resin including carbon black was used as a resist on the copper foil on the second primary surface being printed on the copper foil with a predetermined pattern. After the resin was set, the copper foil was etched including the dyed-black layer. Through the above process, an aggregated electrode 3 and an antistatic layer 6 having a shading property which defined the window portion 7 were formed. The aggregated electrode 3 and the antistatic layer 6 each had a low reflection layer 4 comprising a dyed-black layer formed at the contact surface with the transparent substrate 1 and had a low reflection layer comprising a black insulation resin layer 11 on the exposed side. After removing the mask on the first primary surface, resistance welding was applied to electrically connect both the metal electrode 2 and the external connection terminal with the aggregated electrode 3, respectively. As a result of which, 120 number of metal electrodes 2 were arranged to 8 number of external connection terminals. Further, a UV setting urethane acryl resin was applied to the second primary surface and formed into a protection layer 8 of 20 μm thick.

Light receiving LSI chips 13 and an activating circuit board were joined to this circuit board in the same way as Example 1. In this case, no cracks and separation were detected in the joint portion. By performing the read test with reference to a manuscript 14, it was confirmed that reading was duly performed.

EXAMPLE 19

Figure 17:
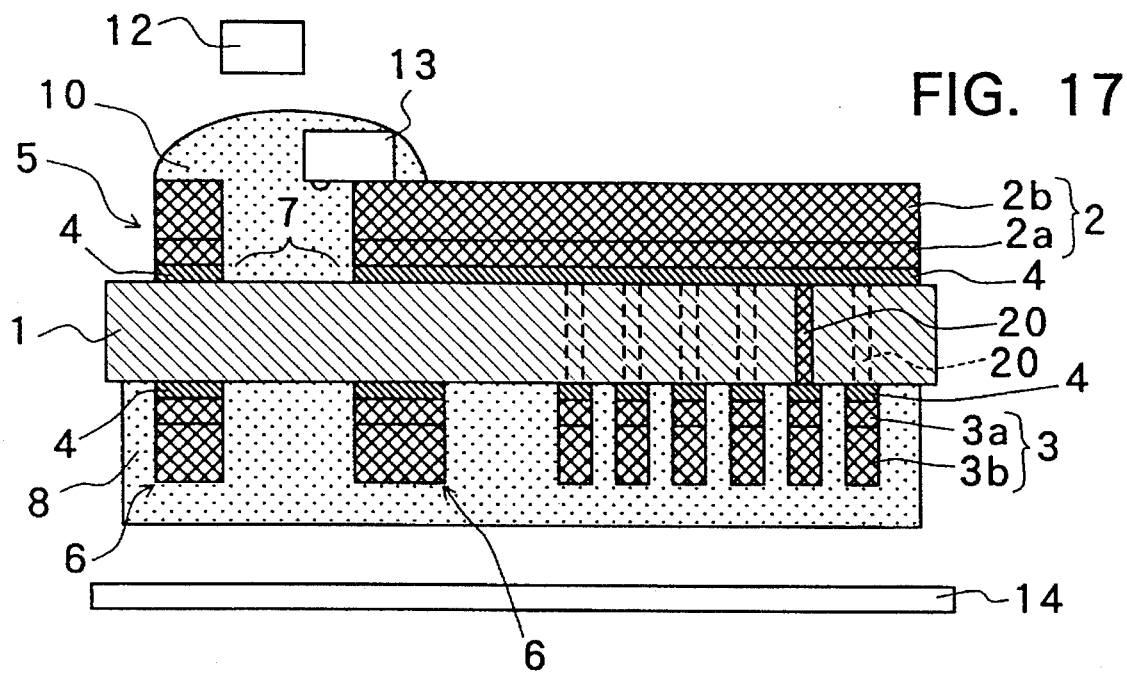
FIG. 17 is a typical cross sectional view showing the structure of an optical circuit board of example 19.

A circuit board shown in FIG. 17 was manufactured. This circuit board has a similar structure to that shown in FIG. 14, but differs in that a protection layer 8 is provided almost all over a second primary surface.

On each of a first and second primary surfaces of a transparent substrate 1 which was a PES film of 50 μm thick, a black chromium oxide layer of 0.1 μm thick was formed as a low reflection layer 4 by means of a DC magnetron sputtering method, and successively a thin copper film of 0.5 μmd thick was formed thereon. A mask for protection use was layered on the second primary surface, and a resist resin was applied on the thin copper film on the first primary surface with a predetermined pattern so that a metal electrode 2, a shading layer 5 and an external connection terminal can be formed. Then, a solder layer of 5 μm thick comprising an Sn-Pb alloy was formed on the first primary surface by electroplating in the alkanol sulfonate bath. Then, after the resist resin was removed, the unnecessary thin copper film was also removed. Through the above process, the metal electrode 2, the shading layer 5 and the external connection terminal were formed. By removing the mask on the second primary surface, layering a mask for protection on the first primary surface and performing the same treatment as performed in the first primary surface, an aggregated electrode 3 and an antistatic layer 6 were formed. Here, the metal electrode 2 and the aggregated electrode 3 were composed of first metal layers of copper 2a, 3a and second metal layers of solder 2b, 3b, respectively.

Next, a heating electrode head and a welding electrode head were contacted to the position where an electrical connection portion 20 was to be formed, thereby electrically connecting between the metal electrode 2 and the aggregated electrode 3 by resistance welding. Thereafter, a UV setting urethane acryl resin of 15 μm thick was applied onto the second primary surface in such a manner that it covered whole area of the aggregated electrode 3, the antistatic layer 6 and a window portion 7, thereby forming a protection layer 8.

On the first primary surface, a thermosetting resin comprising silicon acrylate was applied around the window portion 7 and the metal electrode 2. A plurality of light receiving devices 13 each comprising a semiconductor device having a connection bump were placed on the predetermined metal electrodes 2 respectively, then held at a temperature of 150° C. for 5 minutes under the pressure of 0.5 kgf/cm² per device for connecting the light receiving devices 13 and the metal electrodes 2 corresponding thereto, concurrently setting the resin thereby. Subsequently, an external connection terminal and an external driving circuit board were pressed against to each other with respective bumps mutually pressure contacting at a temperature of 190° C. for 30 seconds for press bonding. As a result, no cracks and separation were detected in the bonding portion. The light from a light source 12 was transmitted through the window portion 7, and irradiated to a manuscript 14 which was moved facing the second primary surface. Then, the reflected light from the manuscript was detected by the light receiving device 13 and read by an optical reader. The result of which proved that the reading function of the optical reader was normal.

EXAMPLE 20

Figure 18:
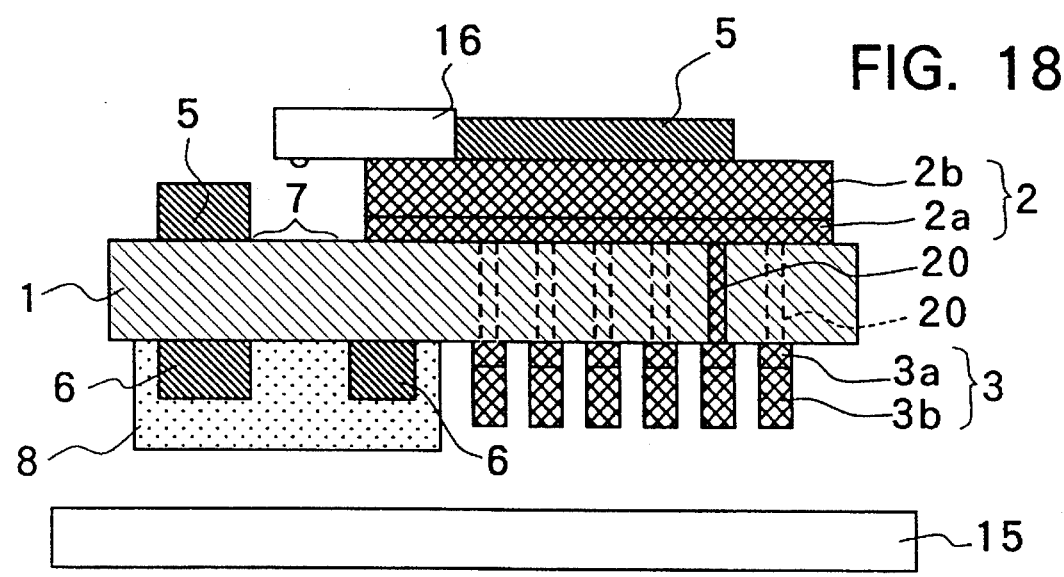
FIG. 18 is a typical cross sectional view showing the structure of an optical circuit board of example 20.

A circuit board shown in FIG. 18 was manufactured. This circuit board is used for an optical image forming apparatus, and has a similar structure to that shown in the first embodiment, but differs in that a metal electrode 2 has a structure in which a first metal layer 2a and a second metal layer 2b are sequentially layered from a transparent substrate 1 side, and a protection layer 8 is not provided on the area where an aggregated electrode 3 is formed, and further a shading layer 5 is provided also in the vicinity of the area on the second metal layer 2b where light emitting LSI chips 16 are mounted.

On each of a first and second primary surfaces of a transparent substrate 1 which was composed of a polyarylate film of 50 μm thick, a thin copper film of 0.5 μm thick was formed by means of a DC magnetron spattering method. A resist resin was printed on the first and second primary surfaces each with a predetermined pattern so that only a metal electrode 2 and an aggregated electrode 3 might be formed. Then, a copper layer of 5 μm thick was formed by electroplating on both sides, and further a solder layer comprising an Sn-Pb alloy of 5 μm thick was formed by electroplating in the alkanol sulfonate bath. Then, after the resist resin was removed, the unnecessary thin copper film was also removed. Through the above process, a metal electrode 2 and an aggregated electrode 3 were formed. These electrodes have the laminated structure composed of first metal layers of copper 2a, 3a and second metal layers of solder 2b, 3b, respectively. The metal electrode 2 and the aggregated electrode 3 were pressed against to each other by an external force thereby completing their electrical connection.

Succeedingly, the resin including black paint was printed on the first primary surface so as to define a window portion 7, thereby forming a shading layer 5 which had a good electric insulation resistance. It was arranged that the shading layer 5 was also provided on the second metal layer 2b at this time. The resin including carbon black particles was applied onto the second primary surface in such a manner that the window portion was defined in the same way as Example 4, and thermally set to form an antistatic layer 6 with a shading property. Further, the protection layer 8 was provided on the second primary surface so as to cover the antistatic layer 6 and the window portion 7.

As light emitting LSI chips 16, LED (light emitting diode) arrays were employed. Bumps of these LED arrays and the metal electrode 2 were pressed against to each other by the pressing force of about 6 kgf/cm² and held at 140° C. for 4 minutes to join. There were no separation and cracks in the joint portion and it was confirmed that this circuit board functioned regularly as a head of an optical printer.

EXAMPLE 21

Figure 19:
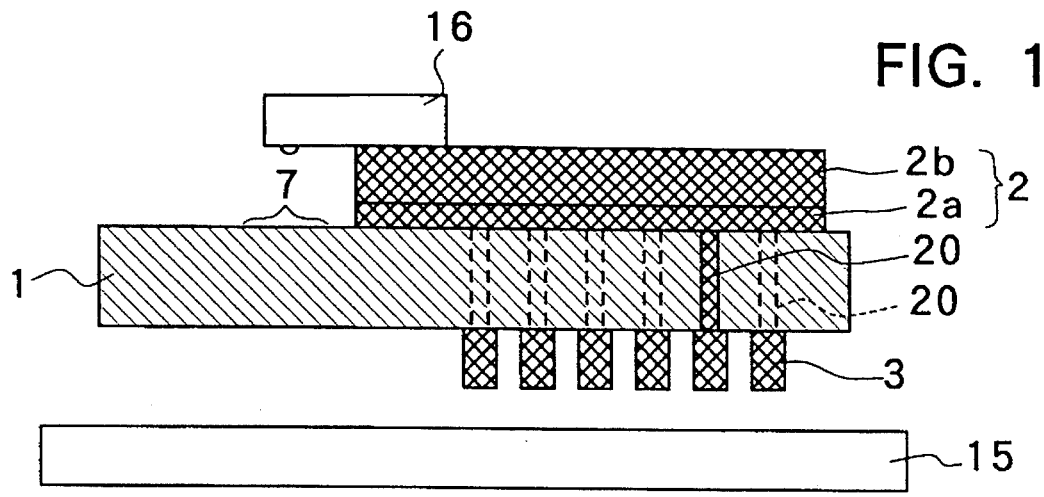
FIG. 19 is a typical cross sectional view showing the structure of an optical circuit board of example 21.

A circuit board shown in FIG. 19 was manufactured. This circuit board has a structure similar to that shown in FIG. 6 of Example 1, but differs in that light emitting LSI chips 16 for writing are mounted in place of light receiving LSI chips, and each metal electrode is composed of a first and second metal layers 2a, 2b.

The circuit board was manufactured in the steps the same as Example 1. A thermosetting resin comprising silicon acrylate was applied on the first primary surface around a window portion 7 and a metal electrode 2. A plurality of light receiving LSI chips 16 each having a connection bump and serving as an image forming LED were placed on a predetermined metal electrodes 2 respectively and held at a temperature of 150° C. for 5 minutes under the pressure of 1 kgf/cm² for connecting the light emitting LSI chips 16 and the metal electrodes 2, and for applying a silicon acrylate to cover the whole light emitting chips 16 and to fill the space between the circuit board and the light emitting LSI chips 16. No cracks and separation were detected in the bonding portion. Thereafter, an external connection terminal on the first primary surface and a connection bump of an external activating circuit board were connected by the connecting operation the same as above. The normal operation of a light printer was confirmed by using the light emitted from the light emitting LSI chips 16 to a photosensitive surface 15.

EXAMPLE 22

Figure 20:
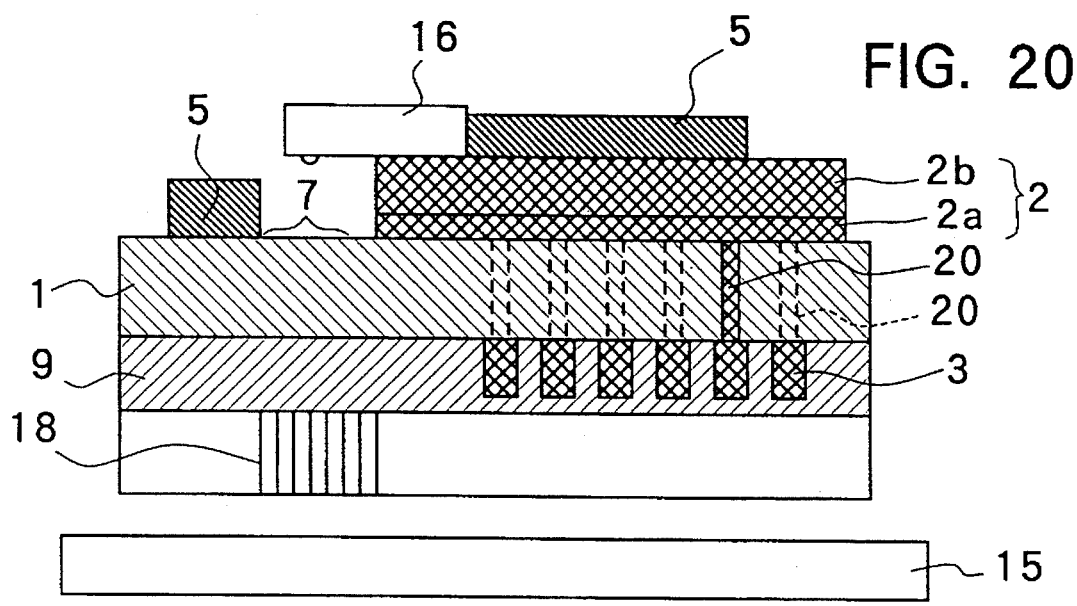
FIG. 20 is a typical cross sectional view showing the structure of an optical circuit board of example 22.

A circuit board was manufactured as shown in FIG. 20 by modifying a circuit board shown in FIG. 19 such that an insulative shading layer 5 was formed by printing the resin containing a black paint so as to define a window portion 7, and together with which a glass fiber array 18 was bonded to a second primary surface through an adhesion layer 9, for completing an optical circuit board with a light guide. A UV setting acrylate resin was used as the adhesion layer 9, and the glass fiber array 18 was disposed at the position corresponding to the window portion 7. The shading layer 5 was also provided on a second metal layer 2b. A plurality of image forming LEDs were used as a light emitting device 16 which irradiated light to a photosensitive surface 15 and tested. The test result proved that such an apparatus worked normally as an optical image forming apparatus.

EXAMPLE 23

Figure 21:
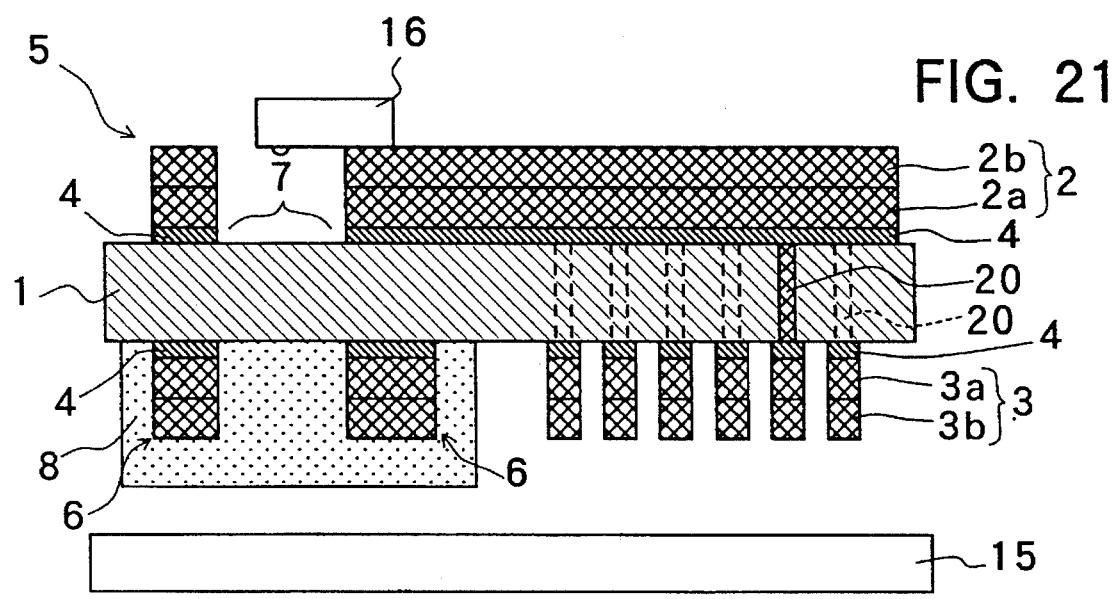
FIG. 21 is a typical cross sectional view showing the structure of an optical circuit board of examples 23 and 25.

A circuit board shown in FIG. 21 was manufactured. This circuit board was of the same structure as that shown in FIG. 10, but differs in that light emitting LSI chips are mounted instead of light receiving LSI chips, and a protection layer 8 is provided on the second primary surface so as to cover an antistatic layer 6 and a window portion 7.

On each of a first and second primary surfaces of a transparent substrate 1 which was composed of a polyarylate film of 50 μm thick, a black nickel oxide layer (low reflection layer 4) of 0.1 μm thick and a thin copper film of 0.5 μm thick were formed by means of a DC magnetron sputtering method. A resist resin was printed on the first and second primary surfaces with a predetermined pattern to form a copper layer of about 5 μm thick on both surfaces by electroplating. Then, a solder layer comprising an Sn-Pb alloy of about 5 μm thick was formed by electroplating in the alkanol sulfonate bath. After the resist resin was removed, the unnecessary nickel oxide and thin copper film were also removed. Through the above process, a metal electrode 2, an aggregated electrode 3, a shading layer 5, an antistatic layer 6 and an external connection terminal were formed. The metal electrode 2 and the aggregated electrode 3 had the layered structure comprising first metal layers of copper 2a, 3a and second metal layers of solder 2b, 3b, respectively. The metal electrode 2 and the external connection terminal were electrically connected with the aggregated electrode 3 by resistance welding, respectively. Further, a protection layer 8 of 10 μm thick comprising a UV setting urethane acryl resin was provided on the second primary surface in such a manner the protection layer covered the antistatic layer 6 and the window portion 7.

As light emitting LSI chips 16, LED arrays were employed. Bumps of these LED arrays and the metal electrodes 2 were pressed against to each other in the same way as in Example 21 by the pressing force of about 2 kgf/cm² and held at 160° C. for 3 minutes to join. No separation or cracks were detected in the joint portion. Subsequently, the external connection terminal and a connection bump of an external activating circuit board were connected. When compared with the conventional circuit board, the number of connection with the activating circuit board was reduced, and it was confirmed that the physical and electrical connection reliability were increased corresponding to the reduced number of the connection. It was further confirmed that this circuit board functioned normally when applied as a head of an optical printer.

EXAMPLE 24

An optical circuit board of the second embodiment was manufactured as shown in FIGS. 5A and 5B. On each of a first and second primary surfaces of a transparent substrate 1 which was composed of a polyarylate film of 50 μm thick, a black nickel oxide layer (low reflection layer) of 0.1 μm thick and a thin copper film of 0.5 μm thick were formed by means of a DC magnetron spattering method. Penetration holes were formed by drilling at the positions where a metal electrode 2 and an external connection terminal 30 were electrically connected with an aggregated electrode 3, respectively.

Subsequently, resist ink was applied to the area where a metal electrode 2, an aggregated electrode 3, an antistatic layer 6 and an external connection terminal 30 were not formed so that the above matters could be formed on both sides of a window portion 7. Further, a copper layer of about 0.3 µm thick was formed on the inside surface of the penetration hole by electroless plating. Next, a copper layer of 5 µm thick was formed on the area exclusive of the resist formation area by electroless plating, and further a solder layer comprising an Sn-Pb alloy of about 5 µm thick was formed by electroplating in the alkanol sulfonate bath. After the resist resin was removed, the unnecessary nickel oxide and thin copper film were also removed by etching. In this way, the metal electrode 2, the aggregated electrode 3, the antistatic layer 6 and the external connection terminal 30 were formed. On the first primary surface, the window portion 7 was defined by the metal electrodes 2 disposed on both sides thereof. On the second primary surface, the window portion 7 was defined by the antistatic layer 6. A protection layer 8 of about 10 µm thick comprising a UV setting urethane acrylate resin was provided so as to cover almost the whole area of the second primary surface.

As light emitting LED chips 16, LSI chips using LEDs for image forming were employed. Together with a thermosetting resin comprising silicon acrylate, a plurality of the light emitting LSI chips 16 were disposed on the corresponding metal electrodes 2, and held under a pressure of about 2 kgf/cm$^2$ at a temperature of 150° C. for 5 minutes, for bonding the both of them. As a result, no separation or cracks are detected in the bonding portion. Further, the external connection terminal 30 and a connection terminal of an external activating circuit board were connected. After confirming that they were electrically perfectly connected with each other, it was confirmed that it worked regularly as a recording head of an optical printer.

EXAMPLE 25

A circuit board was manufactured with a structure similar to that shown in FIG. 20 of Example 22. On each of a first and second primary surfaces of a transparent substrate 1 which was a PES film of 50 µm thick, a black nickel oxide layer of 0.1 µm thick was formed as a low reflection layer 4 by means of a DC magnetron sputtering method, and successively a thin copper film of 0.5 µmd thick was formed thereon.

After a mask for protection use was layered on a thin copper film on the second primary surface and a predetermined pattern of a resist resin was printed on the first primary surface, a copper layer of about 5 µm thick was formed on the first primary surface by electroplating. Then, a solder layer of 5 µm thick comprising an Sn-Pb alloy was formed on the first primary surface by electroplating in the alkanol sulfonate bath. Then, after the resist resin was removed, the unnecessary nickel oxide layer and thin copper film were also removed. Through the above process, a metal electrode 2, a shading layer 5 and an external connection terminal were formed.

After removing the mask on the second primary surface and layering a mask for protection use on the first primary surface, a predetermined pattern of the resist resin was printed on the second primary surface, and then a solder layer was formed by electroplating. Next, the resist resin was removed and successively the unnecessary nickel oxide and thin copper film were removed, thereby forming an aggregated electrode 3 and an antistatic layer 6. Here, the metal electrode 2 and the aggregated electrode 3 had the layered structure composed of first metal layers of copper 2a, 3a and second metal layers of solder 2b, 3b, respectively. At this time, the light reflectance of the low reflection layer 4 was 20%.

Next, the metal electrode 2 and the external connection terminal were electrically connected with the aggregated electrode 3 by means of resistance welding, respectively. Thereafter, a UV setting urethane acryl resin of 15 µm thick was applied onto the second primary surface in such a manner that it covered the antistatic layer 6 and a window portion 7, thereby forming a protection layer 8.

LSI chips using LEDs with bumps were used as light emitting LSI chips 16 for image forming. Together with a thermosetting resin composed of silicon acrylate, this light emitting LSI chips 16 were pressed against the metal electrodes 2 at a temperature of 150° C. for 5 minutes for bonding the light emitting LSI chips 16 with the metal electrodes 2 and concurrently setting the resin. Subsequently, the external connection terminal and a bump on an external activating circuit board were bonded. No cracks and separation were detected in the bonding portion. By transmitting the light from the light emitting LSI chips 16 through the window portion 7 and irradiating onto a photosensitive material 15 which was moving facing the second primary surface, it was confirmed that the image forming activity was normally conducted.

EXAMPLE 26

Figure 22:
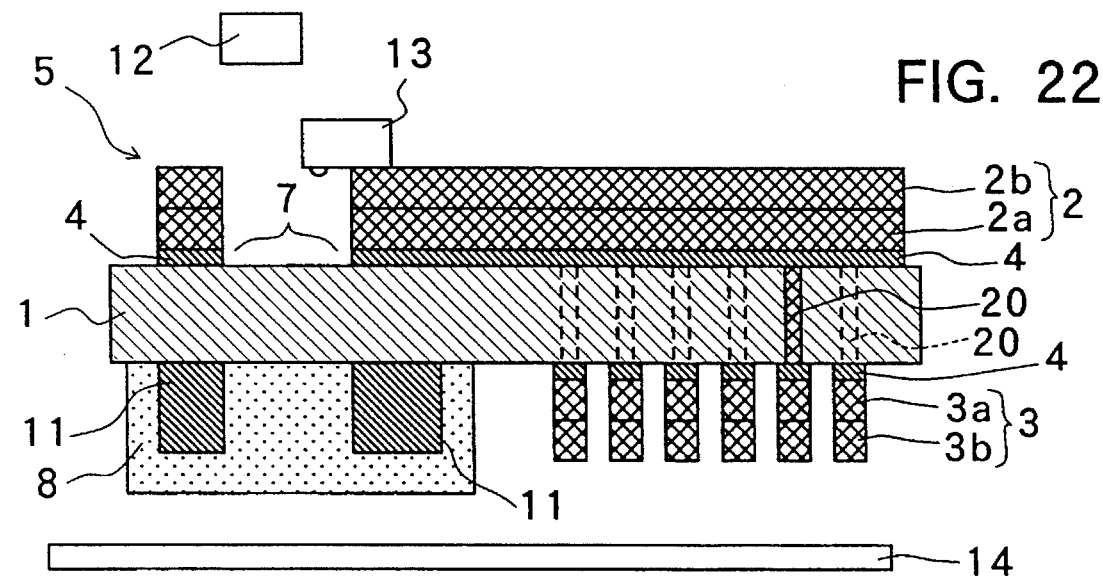
FIG. 22 is a typical cross sectional views showing the structure of an optical circuit board of example 26.

A circuit board shown in FIG. 22 was manufactured. This circuit board was structured in the same way as that shown in FIG. 12, but an insulation layer made of an electrically insulative material was provided on the second primary surface in place of an antistatic layer.

On each of a first and second primary surfaces of a transparent substrate 1 which was a PES film of 50 µm thick, a black nickel oxide layer of 0.1 µm thick was formed as a low reflection layer 4 by means of a DC magnetron sputtering method, and successively a thin copper film of 0.5 µmd thick was formed thereon. After a mask for protection use was layered on a thin copper film on the second primary surface and a predetermined pattern of a resist resin was printed on the first primary surface, a copper layer of about 5 µm thick was formed on the first primary surface by electroplating. Then a solder layer of 5 µm thick comprising an Sn-Pb alloy was formed on the first primary surface by electroplating in the alkanol sulfonate bath. Then, after the resist resin was removed, the unnecessary nickel oxide layer and thin copper film were also removed by etching. Through the above process, a metal electrode 2, a shading layer 5 and an external connection terminal were formed.

After removing the mask on the second primary surface and layering a mask for protection use on the first primary surface, a predetermined pattern of the resist resin was printed on the second primary surface, and then a copper layer of 5 µm thick and a solder layer of 5 µm thick comprising a Sn-Pb alloy were formed by electroplating. Next, the resist resin was removed and successively the unnecessary nickel oxide and thin copper film were removed, thereby forming the aggregated electrode 3. Here, the metal electrode 2 and an aggregated electrode 3 were composed of first metal layers of copper 2a, 3a and second metal layers of solder 2b, 3b, respectively.

Next, the metal electrode 2 and the external connection terminal were electrically connected with the aggregated electrode 3 by means of resistance welding, respectively. A thermosetting resin containing a black pigment was applied to the second primary surface in such a manner the resin defined a window portion 7, and then the resin was set thereby forming a shading layer 11 which comprised a black insulative resin. Thereafter, a UV setting urethane acryl resin of 15 μm thick was applied onto the second primary surface in such a manner that it covered the shading layer 11 and the window portion 7, thereby forming a protection layer 8.

This circuit board and light receiving LSI chips 13 with bumps were connected in the same way as Example 1, and further, the external connection terminal and an activating circuit board were connected. There are no cracks or separation detected in the connection, however, when a read test was performed with reference to a manuscript 14, a noise was generated when reading the manuscript 14 resulting in a poor and incorrect reading. The reason of which was considered that an electrical noise was generated due to static caused by rubbing between the manuscript 14 and the circuit board. From this, it will be understood that it is effective to provide the antistatic layer on the second primary surface for preventing the noise, particularly for the matter with a structure in which a transparent resin protection layer is provided.

EXAMPLE 27

On each of a first and second primary surfaces composed of a PES film of 50 μm thick, a black nickel oxide layer (low reflection layer) of 0.1 μm thick and a thin copper film of 0.5 μmd thick were formed sequentially by means of a DC magnetron sputtering method. After a predetermined pattern of a resist resin was printed on both the first and second primary surfaces, a copper layer of about 5 μm thick was formed on the thin copper film. Thereafter, the above product was dipped in a solder bath of 240° C. and tried to form a solder layer on the copper layer. However, the PES film which constituted the transparent substrate contracted, and no circuit board practically usable were produced. Therefore, it is made clear that a solder layer to be provided on the metal electrode for facilitating the press bonding of devices is to be formed by means of such as plating which is carried out at a room temperature.

EXAMPLE 28

Figure 23:
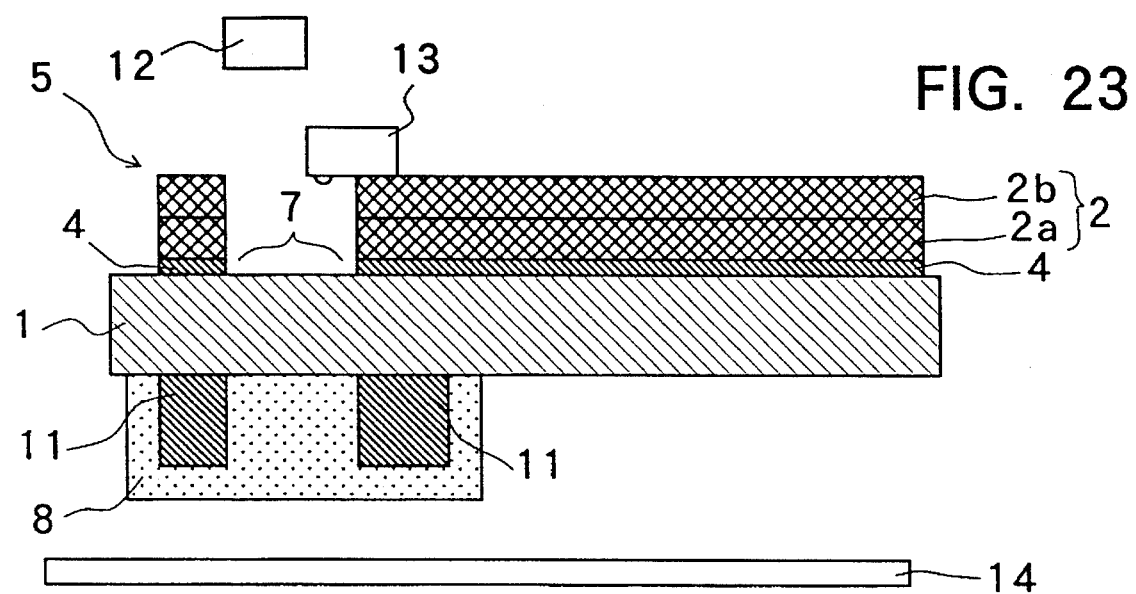
FIG. 23 is a typical cross sectional views showing the structure of an optical circuit board of example 28.

A circuit board shown in FIG. 23 was manufactured. This circuit board has a structure without an aggregated electrode. When this circuit board is connected with an external activating circuit board, each metal electrode of the circuit board and each connection bump of the external activating circuit board is connected with one to one correspondence to each other.

On a first primary surface of a transparent substrate 1 which was a PES film of 50 μm thick, a black nickel oxide layer (low reflection layer 4) of 0.1 μm thick and a thin copper film of 0.5 μmd thick were formed sequentially by means of a DC magnetron spattering method. After a predetermined pattern of a resist resin was printed on the first primary surface, a copper layer of about 5 μm thick was formed on the first primary surface by electroplating. Then, a solder layer of 5 μm thick comprising an Sn-Pb alloy was formed on the first primary surface. After the resist resin was removed, the unnecessary nickel oxide and thin copper film were also removed by etching. Through the above process, a metal electrode 2 having a laminated structure of a first metal layer 2a composed of copper and a second metal layer 2b composed of solder was formed. Here, 150 number of the metal electrodes 2 of each 0.9 mm wide were formed on one side of a window portion 7.

Next, by printing a mixture of a thermosetting resin containing carbon black particles by screen printing on a first and second primary surfaces and then thermosetting the resin, a shading layer 5 and an antistatic layer 6 were formed. The shading layer 5 was formed on the first primary surface on one side of the window portion 7. The antistatic layer 6 having a shading property was provided on the second primary surface so as to define the window portion 7. Further, a protection layer 8 was provided on the second primary surface with the a UV setting urethane acryl resin of 15 μm thick in such a manner that the protection layer covered the antistatic layer 6 and the window portion 7.

After bonding thus completed circuit board and a light receiving device 13 with a bump, each metal electrode 2 and each connection bump of an activating circuit board is bonded as a group at a temperature of 195° C. being maintained for 30 seconds. However, the PES film which constituted the transparent substrate 1 contracted during the above process. Accordingly, some of 150 number of electrodes failed in connecting with the external activating circuit board. Therefore, this circuit board was unable to work normally as a read sensor of an optical reader.

It is to be understood that variations and modifications of the circuit board for optical devices disclosed herein will be evident to those skilled in the art. It is intended that all such modifications and variations be included within the scope of the appended claims.

What is claimed is:

1. An optical circuit board for adapted mounting one or more LSI chips for emitting and/or receiving light, comprising:

a transparent substrate;

a window portion which is formed as a slit-like transparent region of said transparent substrate for transmitting light coming in and going out of said LSI chip;

a plurality of electrodes provided on a first primary surface of said transparent substrate corresponding to said LSI chip respectively and disposed at least on one side of said window portion along the longitudinal direction of said window portion;

a plurality of aggregated electrodes provided on a second primary surface on a region corresponding to said electrodes in a manner extending respectively in the longitudinal direction of said window portion, said second primary surface being opposite to said first primary surface with reference to said transparent substrate; and an electrical connection portion penetrating said transparent substrate; wherein each of said aggregated electrodes is electrically connected with a plurality of electrodes which constitute a part of said electrodes through said electrical connection portion, respectively.

2. The optical circuit board according to claim 1, wherein said electrode is composed of at least one metal selected from the group consisting of gold, silver, copper, nickel, chromium, tungsten, tin, lead, solder, and an alloy thereof.

3. The optical circuit board according to claim 1, wherein said electrode is composed of a laminate having a first metal layer and a second metal layer formed on said first metal layer.

4. The optical circuit board according to claim 3, wherein each of said first and second metal layers is composed of at least one metal selected from the group consisting of gold, silver, copper, nickel, chromium, tungsten, tin, lead, solder, and an alloy thereof; and said second metal layer is formed in such a manner that one or more LSI chips can be mounted thereon by press-bonding and can be mounted thereon by heat-bonding.

5. The optical circuit board according to claim 4, wherein said second metal layer is formed by plating using at least one material selected from a group consisting of gold and solder.

6. The optical circuit board according to claim 4, wherein said second metal layer is formed by printing using at least one material selected from a group consisting of a gold, silver and solder layer.

7. The optical circuit board according to claim 1, wherein said aggregated electrode is composed of at least one metal selected from the group consisting of gold, silver, copper, nickel, chromium, tungsten, tin, lead, solder, and an alloy thereof.

8. The optical circuit board according to claim 1, wherein a plurality of external connection terminals electrically connected with said plurality of aggregated electrodes respectively are provided on a primary surface of said transparent substance, said transparent substrate including said first primary surface and said second primary surface.

9. The optical circuit board according to claim 8, wherein said external connection terminal is composed of at least one metal selected from the group consisting of gold, silver, copper, nickel, chromium, tungsten, tin, lead, solder, and an alloy thereof.

10. The optical circuit board according to claim 9, wherein said external connection terminal is provided on the first primary surface, and the electrical connection portion for electrically connecting each said external connection terminal and each said aggregated electrode is provided penetrating through said transparent substrate.

11. The optical circuit board according to claim 1, wherein a common electrode to which a plurality of electrodes which constitute a part of said electrodes are commonly connected and an external connection terminal to be electrically connected to said common electrode, are both provided on said first primary surface.

12. The optical circuit board according to claim 1, wherein a common electrode to which a plurality of electrodes which constitute a part of said electrodes are commonly connected is provided on said first primary surface, a plurality of external connection terminals are provided on a primary surface of said transparent substrate, said transparent substrate including said first and second primary surfaces, and each of the said external connection terminals is electrically connected with each of said aggregated electrodes and said common electrode.

13. The optical circuit board according to claim 1, wherein a shading layer for defining said window portion and preventing the light passing through an area other than said window portion in the transparent substrate is provided on a primary surface of said transparent substrate including said first and second primary surfaces bordering on said window portion.

14. The optical circuit board according to claim 1, wherein a shading layer for defining said window portion and preventing the light passing through an area other than said window portion in the transparent substrate is provided on said first primary surface in opposite relationship to said metal electrodes interposing said window portion bordering thereon.

15. The optical circuit board according to claim 1, wherein a shading layer for defining said window portion and preventing the light passing through the area other than said window portion in said transparent substrate is provided on said first primary surface so as to be disposed on said metal electrodes and on each space between neighboring metal electrodes.

16. The optical circuit board according to claim 13, wherein said shading layer is composed of metal.

17. The optical circuit board according to claim 13, wherein said shading layer is composed of the resin containing carbon black particles or color pigment components.

18. The optical circuit board according to claim 1, wherein a conductive antistatic layer is provided on said second primary surface.

19. The optical circuit board according to claim 18, wherein said antistatic layer is composed of a member having a shading property and provided so as to define said window portion while preventing the light passing through an area other than said window portion in said transparent substrate.

20. The optical circuit board according to claim 19, wherein said antistatic layer is composed of metal.

21. The optical circuit board according to claim 19, wherein said antistatic layer is composed of a resin having particles selected from a grove consisting of carbon black and metal particles dispersed therein.

22. The optical circuit board according to claim 19, wherein said antistatic layer is formed so as to enclose the circumference of said window portion.

23. The optical circuit board according to claim 19, wherein said antistatic layer is provided extending in the longitudinal direction of said window portion being disposed on both sides thereof.

24. The optical circuit board according to claim 1, further comprising a light guide provided on said second primary surface for guiding the light from said window portion and to said window portion.

25. The optical circuit board according to claim 1, wherein a low reflection layer is provided in the bonding interface between said electrode and said transparent substrate.

26. The optical circuit board according to claim 1, wherein a low reflection layer is provided in the bonding interface between said aggregated electrode and said transparent substrate.

27. The optical circuit board according to claim 13, wherein a low reflection layer is provided in the bonding interface between said shading layer and said transparent substrate.

28. The optical circuit board according to claim 19, wherein a low reflection layer is provided in the bonding interface between said antistatic layer and said transparent substrate.

29. The optical circuit board according to any one of claims 25, 26, 27 and 28, wherein the light reflectance of said low reflection layer is 50% or less.

30. The optical circuit board according to any one of claims 25, 26, 27 and 28, wherein said low reflection layer is composed of one material selected from a group consisting of a metal, a metal compound, resin and an organic compound.

31. The optical circuit board according to claim 1, wherein a transparent protection layer is provided on said second primary surface in such a manner that the protection layer covers said window portion.

32. The optical circuit board according to claim 19, wherein a transparent protection layer is provided on said second primary surface for protecting portions of the second primary surface such as said window portion and said antistatic layer.

33. The optical circuit board according to claim 1, wherein said transparent substrate is composed of a flexible film-like material.

34. The optical circuit board according to claim 33, wherein said transparent substrate is composed of at least one selected from the group consisting of polyethylene terephthalate, polyethylene naphthalate, polyamide, polyether, polysulfone, polyethersulfone, polycarbonate, polyarylate, polyetherimide, polyether etherketone, polyimide, polyparabanic acid, and copolymer thereof.

35. The optical circuit board according to claim 33, wherein the thickness of said transparent substrate is in the range of 5 to 500 μm.

36. The optical circuit board according to claim 33, wherein the thickness of said transparent substrate is in the range of 10 to 200 μm.

37. The optical circuit board according to claim 33, wherein the thickness of said transparent substrate is in the range of 20 to 50 μm.

38. An optical circuit board adapted for mounting thereon one or more optical reading LSI chips with connection bumps used in an optical reader for optically reading a manuscript, comprising:

a transparent substrate;

a window portion which is formed as a slit-shaped transparent region of said transparent substrate for transmitting the light incident upon said reading devices;

a plurality of electrodes provided on a first primary surface of said transparent substrate to be used for electrical connection with said LSI chip respectively and disposed at least on one side of said window portion along the longitudinal direction of said window portion;

a plurality of aggregated electrodes provided on a second primary surface on a region corresponding to said electrodes in a manner extending respectively in the longitudinal direction of said window portion, said second primary surface being disposed opposite to said first primary surface with reference to said transparent substrate; and an electrical connection portion penetrating said transparent substrate; wherein said circuit board is disposed with the longitudinal direction of said window portion traversing the direction of the relative movement of said manuscript exercised with reference to said optical reader; and each of said aggregated electrodes is electrically connected with a plurality of electrodes which constitute a part of said electrodes, through said electrical connection portion.

39. An optical circuit board adapted for mounting one or more optical image forming LSI chips with connection bumps used in an optical image forming apparatus for optically forming an image with reference to photosensitive matter, comprising:

a transparent substrate;

a window portion which is formed as a slit-shaped transparent region of said transparent substrate for transmitting the light emitted from said optical image forming LSI chip;

a plurality of electrodes provided on a first primary surface of said transparent substrate to be used for electrical connection with said optical image forming LSI chip, respectively, and disposed at least on one side of said window portion along the longitudinal direction of said window portion;

a plurality of aggregated electrodes provided on a second primary surface on a region corresponding to said electrodes in a manner extending respectively in the longitudinal direction of said window portion, said second primary surface being disposed opposite to said first primary surface with reference to said transparent substrate; and an electrical connection portion penetrating said transparent substrate; wherein said circuit board is placed with the longitudinal direction of said window portion traversing the direction in which the relative movement between said photosensitive matter and said optical image forming apparatus occurs; and each of said aggregated electrodes is electrically connected with a plurality of electrodes which are included in said electrodes through said electrical connection portion, respectively.

\* \* \* \* \*